United States Patent
Trombley

(10) Patent No.: US 9,710,324 B2
(45) Date of Patent: Jul. 18, 2017

(54) DUAL IN-LINE MEMORY MODULES (DIMMS) SUPPORTING STORAGE OF A DATA INDICATOR(S) IN AN ERROR CORRECTING CODE (ECC) STORAGE UNIT DEDICATED TO STORING AN ECC

(71) Applicant: QUALCOMM Incorporated, San Diego, CA (US)

(72) Inventor: Michael Raymond Trombley, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 71 days.

(21) Appl. No.: 14/857,491

(22) Filed: Sep. 17, 2015

(65) Prior Publication Data

US 2016/0224414 A1 Aug. 4, 2016

Related U.S. Application Data

(60) Provisional application No. 62/111,358, filed on Feb. 3, 2015.

(51) Int. Cl.
G06F 11/10 (2006.01)
H03M 13/17 (2006.01)

(52) U.S. Cl.
CPC ......... G06F 11/1012 (2013.01); H03M 13/17 (2013.01)

(58) Field of Classification Search
CPC ............. G06F 11/1012; G06F 11/1044; G06F 2212/401; H03M 13/17; G11C 5/04
See application file for complete search history.

(56) References Cited

U.S. PATENT DOCUMENTS 6,092,182 A 7/2000 Mahalingaiah
6,618,831 B2 9/2003 Lippincott
(Continued)

FOREIGN PATENT DOCUMENTS

WO 2014051625 A1 4/2014

OTHER PUBLICATIONS

D. J. Palframan, N. S. Kim and M. H. Lipasti, "COP: To compress and protect main memory," 2015 ACM/IEEE 42nd Annual International Symposium on Computer Architecture (ISCA), Portland, OR, 2015, pp. 682-693.*
(Continued)

*Primary Examiner* — Cynthia Britt
(74) *Attorney, Agent, or Firm* — Withrow & Terranova, PLLC

(57) ABSTRACT

A dual in-line memory module (DIMM) supporting storage of a data indicator(s) in an error correcting code (ECC) storage unit dedicated to storing an ECC. The DIMM is configured to provide a burst ECC storage unit striped in a burst data storage unit. The DIMM is configured to stripe a received burst data word across a burst data word storage unit at a write data address for a write operation. The DIMM is also configured to stripe a received burst ECC word for the burst data word across the burst ECC storage unit at the write data address in fewer bits than a number of data bit cells in the burst ECC storage unit. In this manner, the DIMM can store at least one data indicator for a burst data word in an extra, leftover bit(s) in the burst ECC storage unit.

30 Claims, 17 Drawing Sheets

(56) References Cited

U.S. PATENT DOCUMENTS

| | | | |
|---|---|---|---|
| 6,981,119 B1* | 12/2005 | Lepak | G06F 12/023 |
| | | | 710/68 |
| 7,340,666 B1 | 3/2008 | Wright et al. | |
| 7,437,597 B1 | 10/2008 | Kruckemyer et al. | |
| 8,510,518 B2 | 8/2013 | O'Connor | |
| 8,533,558 B2 | 9/2013 | Yurzola et al. | |
| 8,924,816 B2 | 12/2014 | Khan | |
| 9,529,670 B2* | 12/2016 | O'Connor | G06F 11/1076 |
| 2005/0160311 A1* | 7/2005 | Hartwell | G06F 11/076 |
| | | | 714/6.32 |
| 2005/0268046 A1* | 12/2005 | Heil | G06F 12/0862 |
| | | | 711/137 |
| 2009/0198887 A1* | 8/2009 | Watanabe | G06F 11/1076 |
| | | | 711/114 |
| 2011/0320913 A1* | 12/2011 | Stracovsky | G06F 11/1012 |
| | | | 714/763 |
| 2012/0023387 A1* | 1/2012 | Wang | G06F 11/1048 |
| | | | 714/773 |
| 2013/0179752 A1* | 7/2013 | Shim | G06F 11/1004 |
| | | | 714/773 |

OTHER PUBLICATIONS

International Search Report and Written Opinion for PST/US2016/014686, mailed May 4, 2016, 12 pages.
International Preliminary Report on Patentability for PCT/US2016/014688, mailed Jan. 27, 2017, 22 pages.

\* cited by examiner

DUAL IN-LINE MEMORY MODULES (DIMMS) SUPPORTING STORAGE OF A DATA INDICATOR(S) IN AN ERROR CORRECTING CODE (ECC) STORAGE UNIT DEDICATED TO STORING AN ECC

PRIORITY APPLICATION

The present application claims priority to U.S. Provisional Patent Application Ser. No. 62/111,358 filed on Feb. 3, 2015 and entitled "MEMORY CONTROLLERS EMPLOYING MEMORY BANDWIDTH COMPRESSION WITH COMPRESSION INDICATOR PROVIDED IN DATA LINE ERROR CORRECTING CODES (ECCs), AND RELATED PROCESSOR-BASED SYSTEMS AND METHODS," which is incorporated herein by reference in its entirety.

BACKGROUND

I. Field of the Disclosure

The technology of the disclosure relates to memory controllers providing an interface to memory systems in computer systems.

II. Background

Microprocessors perform computational tasks in a wide variety of applications. A typical microprocessor application includes one or more central processing units (CPUs) that execute software instructions. The software instructions may instruct a CPU to fetch data from a location in memory, perform one or more CPU operations using the fetched data, and generate a result. The result may then be stored in memory. As non-limiting examples, this memory can be a cache local to the CPU, a shared local cache among CPUs in a CPU block, a shared cache among multiple CPU blocks, or main memory of the microprocessor.

In this regard, FIG. 1 is a schematic diagram of an exemplary system-on-a-chip (SoC) 10 that includes a CPU-based system 12. The CPU-based system 12 includes a plurality of CPU blocks 14(1)-14(N) in this example, wherein 'N' is equal to any number of CPU blocks 14(1)-14(N) desired. In the example of FIG. 1, each of the CPU blocks 14(1)-14(N) contains two CPUs 16(1), 16(2). The CPU blocks 14(1)-14(N) further contain shared Level 2 (L2) caches 18(1)-18(N), respectively. A shared Level 3 (L3) cache 20 is also provided for storing cached data that is used by any of, or shared among, each of the CPU blocks 14(1)-14(N). An internal system bus 22 is provided to enable each of the CPU blocks 14(1)-14(N) to access the shared L3 cache 20 as well as other shared resources. Other shared resources accessed by the CPU blocks 14(1)-14(N) through the internal system bus 22 may include a memory controller 24 for accessing a main, external memory (e.g., double-rate dynamic random access memory (DRAM) (DDR) provided in a dual in-line memory module (DIMM), as a non-limiting example), peripherals 26, other storage 28, an express peripheral component interconnect (PCI) (PCI-e) interface 30, a direct memory access (DMA) controller 32, and/or an integrated memory controller (IMC) 34.

As CPU-based applications executing in the CPU-based system 12 in FIG. 1 increase in complexity and performance, memory capacity can be a constraint. However, providing additional memory capacity in a CPU-based system increases costs and area needed for memory on an integrated circuit (IC). For example, if a CPU-based system, such as the CPU-based system 12 in FIG. 1, were provided in an SoC, such as the SoC 10, adding additional memory capacity may increase the SoC packaging. Data compression may be employed to increase the effective memory capacity of a CPU-based system without increasing physical memory capacity. Data compression can also be employed to increase memory access bandwidth between a memory controller and memory.

For example, data for a write operation in the CPU-based system 12 in FIG. 1 can be compressed, and the memory controller 24 may be configured to compress the data according to a defined compression algorithm. The compressed data is then written in compressed form at the data address in memory for the write operation. When a read operation is performed by the memory controller 24, the memory controller 24 needs to be able to determine if the data stored at the accessed data address in memory is stored in compressed or uncompressed form. In this regard, a data indicator may be provided that is associated with the data address in memory. In this manner, the memory controller 24 can consult the data indicator for a read operation for a given data address to determine if the read data should be uncompressed. However, providing additional data indicators associated with the data addresses in memory increases memory size. Also, if it is desired to read the data indicator in the same burst as the data at a given data address, the memory data bus width between the memory controller 24 and memory would have to be increased, which may be undesirable.

It is desirable to provide for storing and accessing an indicator, such as a data indicator, in association with memory in a compressed memory system to determine if read data is compressed or uncompressed as an example, without expanding memory size and without increasing the width of a memory data bus.

SUMMARY OF THE DISCLOSURE

Aspects disclosed herein include dual in-line memory modules (DIMMs) supporting storage of a data indicator(s) in an error correcting code (ECC) storage unit dedicated to storing an ECC. In this manner, the data indicator(s) may be stored in the DIMM without the need to provide additional data storage in the DIMM and increase the data width of the DIMM and/or the data bus width of the DIMM. Related memory controllers, memory systems, and methods are also disclosed. In this manner, additional memory is not required to be provided to store data indicators. Data indicators may be stored in an ECC storage unit in the DIMM for a variety of non-limiting applications. For example, a data indicator may be stored in an ECC storage unit as a data indicator for indicating if data stored in memory is compressed or uncompressed. Another example where it may be desired to store a data indicator in an ECC storage unit in a DIMM may be to store cache coherency information in the DIMM used as a cache memory, such as whether each cache line of data in the DIMM is present on other processing nodes in the system.

In this regard, in certain aspects disclosed herein, a dual in-line memory module (DIMM) is provided that supports storage of a data indicator(s) in an error correcting code (ECC) storage unit dedicated to storing an ECC. The DIMM provides storage for data in a central processing unit (CPU)-based system. A memory controller provides an interface to the DIMM for read and write operations. The DIMM is configured in a plurality of burst data storage units. A burst data storage unit is a storage unit bit size in the DIMM for a burst data transaction according to a burst data length provided by the memory controller in the CPU-based system. For example, a burst data length may be four (4) data line storage units in the DIMM, wherein each data line storage unit is sixty-four (64) data bit cells. The DIMM is also configured to provide a burst ECC storage unit striped over a plurality of ECC line storage units each corresponding to a data line storage unit. For example, each ECC line storage unit includes an ECC byte storage unit comprising eight (8) data bit cells. In this regard, the DIMM is seventy-two (72) bits wide (i.e., each data line storage unit being sixty-four (64) bit cells for storing sixty-four (64) data bits and an eight (8) bit cell ECC line storage unit for storing eight (8) ECC bits). Thus, the memory bus between the memory controller and the DIMM is provided to be seventy-two (72) bits wide. Thus, in this example, each burst data storage unit can store two hundred fifty-six (256) bits of burst data (i.e., burst length of four (4) times sixty-four (64) bit data byte storage unit) and thirty-two (32) bits of a burst ECC word for the burst data (i.e., burst length of four (4) times eight (8) bit ECC byte storage unit).

For an exemplary write operation, the DIMM is configured to receive a burst data word, a burst ECC word for the burst data word, and a data indicator for the burst data word. The DIMM is then configured to stripe the received burst data word across the burst data word storage unit in the burst data storage unit at a write data address for the write operation. The DIMM is also configured to stripe the received burst ECC word for the burst data word across the burst ECC storage unit in fewer bits than a number of data bit cells in the burst ECC storage unit. In this manner, the DIMM can be configured to store at least one data indicator for the burst data word in the extra, leftover bit(s) in the burst ECC storage unit of the burst data storage unit, such that memory size does not have to be increased to store a data indicator(s). Also, the memory data bus width of the DIMM does not have to be increased (e.g., beyond seventy-two (72) bits in the above referenced example) to avoid an increase in latency, because the data indicator can be written or read in the write or read operation for a burst data word in the DIMM as part of the ECC in the same burst cycle.

In this regard, in one aspect a DIMM is provided. The DIMM comprises a plurality of burst data storage units. Each burst data storage unit among the plurality of burst data storage units comprises a burst data word storage unit striped over a plurality of data line storage units totaling a burst length. Each data line storage unit among the plurality of data line storage units comprises sixty-four (64) data bit cells. Each burst data storage unit among the plurality of burst data storage units further comprises a burst ECC storage unit striped over a plurality of ECC line storage units. Each ECC line storage unit among the plurality of ECC line storage units corresponds to a data line storage unit, and comprises eight (8) data bit cells. The DIMM is configured to receive a write data address for a burst memory write request, and receive burst write data of a burst write data block length for the burst memory write request. The burst write data comprises a burst write data word, a burst ECC word for the burst write data word, and at least one data indicator for the burst write data word. The DIMM is further configured to stripe the received burst write data word across the burst data word storage unit at the received write data address. The DIMM is also configured to stripe the received burst ECC word for the burst write data word across the burst ECC storage unit in fewer bits than a number of data bit cells in the burst ECC storage unit at the received write data address. The DIMM is further configured to store the at least one data indicator for the burst write data word in the burst ECC storage unit of the burst data storage unit at the received write data address.

In another aspect a method of writing data to a DIMM in a CPU-based system is provided. The method comprises receiving a memory write request in a DIMM. The memory write request comprises a write data address and burst write data of a burst write data block length. The burst write data comprises a burst write data word, a burst ECC word for the burst write data word, and at least one data indicator for the burst write data word. The method also comprises striping the received burst write data word across a burst data word storage unit in a burst data storage unit at the received write data address in the DIMM. The DIMM comprises a plurality of burst data storage units. Each burst data storage unit among the plurality of burst data storage units comprises a burst data word storage unit striped over a plurality of data line storage units totaling a burst length. Each data line storage unit among the plurality of data line storage units comprises sixty-four (64) data bit cells. Each burst data storage unit among the plurality of burst data storage units further comprises a burst ECC storage unit striped over a plurality of ECC line storage units. Each ECC line storage unit among the plurality of ECC line storage units corresponds to a data line storage unit, and comprises eight (8) data bit cells. The method further comprises striping the received burst ECC word in the DIMM for the burst write data word across the burst ECC storage unit in fewer bits than a number of data bit cells in the burst ECC storage unit at the received write address.

In another aspect a memory system for a CPU-based system is provided. The memory system comprises a DIMM. The DIMM comprises a plurality of burst data storage units. Each burst data storage unit among the plurality of burst data storage units comprises a burst data word storage unit striped over a plurality of data line storage units totaling a burst length. Each data line storage unit among the plurality of data line storage units comprises sixty-four (64) data bit cells. Each burst data storage unit among the plurality of burst data storage units further comprises a burst ECC storage unit striped over a plurality of ECC line storage units. Each ECC line storage unit among the plurality of ECC line storage units corresponds to a data line storage unit, and comprises eight (8) data bit cells. The DIMM is configured to receive a burst memory write request comprising a write data address and burst write data of a burst write data block length. The burst write data comprises a burst write data word, a burst ECC word for the burst write data word, and at least one data indicator for the burst write data word. The DIMM is also configured to stripe the received burst write data word across the burst data word storage unit at the received write data address. The DIMM is further configured to stripe the received burst ECC word for the burst write data word across the burst ECC storage unit in fewer bits than a number of data bit cells in the burst ECC storage unit at the received write data address. The DIMM is further configured to store the at least one data indicator for the burst write data word in the burst ECC storage unit of the burst data storage unit at the received write data address. The memory system further comprises a memory controller. The memory controller is configured to receive a memory write request comprising the write data address and write data of a write data block length. The memory controller is configured to calculate one or more burst ECC words for the write data, each of the one or more burst ECC words having a length less than the number of data bit cells in the burst ECC storage unit, according to a defined ECC. The memory controller is also configured to construct one or more burst write data of the burst write data block length based on the write data. Each of the one or more burst write data comprises a burst write data word, a burst ECC word for the burst write data word, and at least one data indicator for the burst write data word. The memory controller is further configured to communicate the write data address and the one or more burst write data words to the DIMM to be stored at the write data address in the DIMM.

In another aspect a method of writing data to a memory system in a CPU-based system is provided. The method comprises receiving a memory write request comprising a write data address and write data of a write data block length. The method further comprises calculating one or more burst ECC words for the write data, each of the one or more burst ECC words having a length less than a number of data bit cells in a burst ECC storage unit, according to a defined ECC. The method also comprises constructing one or more burst write data of a burst write data block length based on the write data. Each of the one or more burst write data comprising a burst write data word, a burst ECC word for the burst write data word, and at least one data indicator for the burst write data word. The method further comprises communicating the write data address and one or more burst write data words to a DIMM to be stored at the write data address in the DIMM. The method also comprises receiving the memory write request in the DIMM. The memory write request comprises the write data address and the one or more burst write data of the burst write data block length, the one or more burst write data comprising a burst write data word, a burst ECC word for the burst write data word, and at least one data indicator for the burst write data word. The method further comprises striping the received burst write data word across a burst data word storage unit in a burst data storage unit at the received write data address in the DIMM. The DIMM comprises a plurality of burst data storage units. Each burst data storage unit among the plurality of burst data storage units comprises a burst data word storage unit striped over a plurality of data line storage units totaling a burst length. Each data line storage unit among the plurality of data line storage units comprises sixty-four (64) data bit cells. Each burst data storage unit among the plurality of burst data storage units comprises an ECC storage unit striped over a plurality of ECC line storage units, each ECC line storage unit among the plurality of ECC line storage units corresponding to a data line storage unit, and comprising eight (8) data bit cells. The method further comprises striping the received one or more burst ECC words in the DIMM for the burst write data word across the burst ECC storage unit in fewer bits than a number of data bit cells in the burst ECC storage unit at the received write data address.

DETAILED DESCRIPTION

Figure 1:
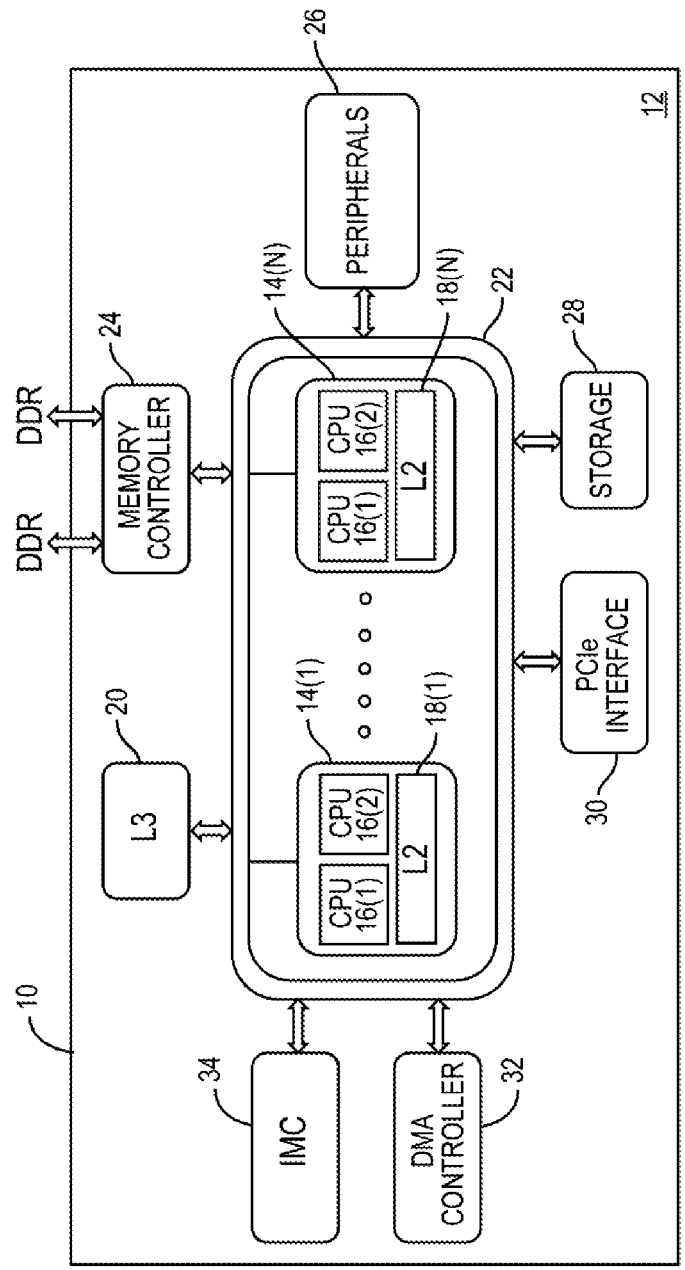
FIG. 1 is a schematic diagram of an exemplary system-on-a-chip (SoC) that includes a central processing unit (CPU)-based system.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 2:
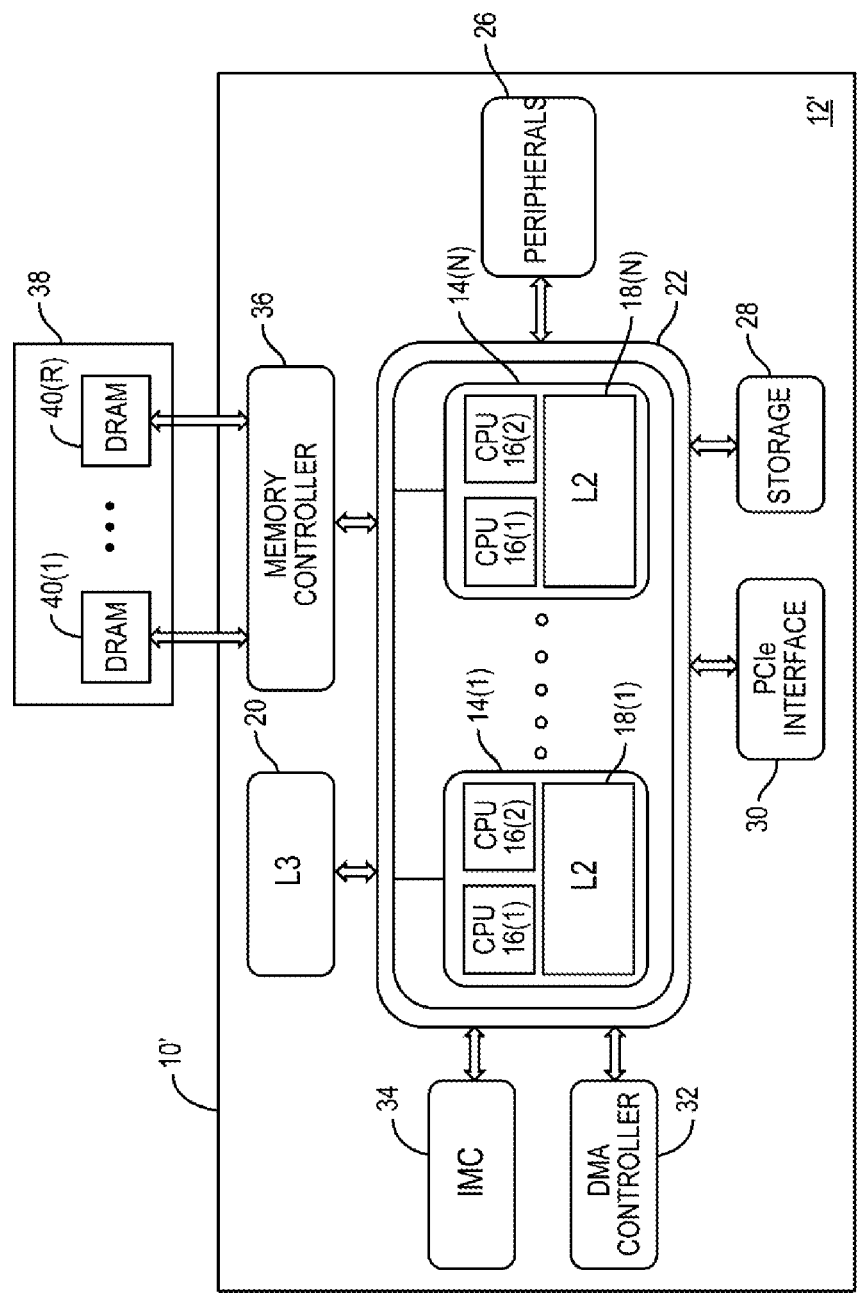
FIG. 2 is a schematic diagram of an SoC that includes an exemplary CPU-based system having a plurality of CPUs and a memory controller configured to provide memory bandwidth compression.
Figure 3:
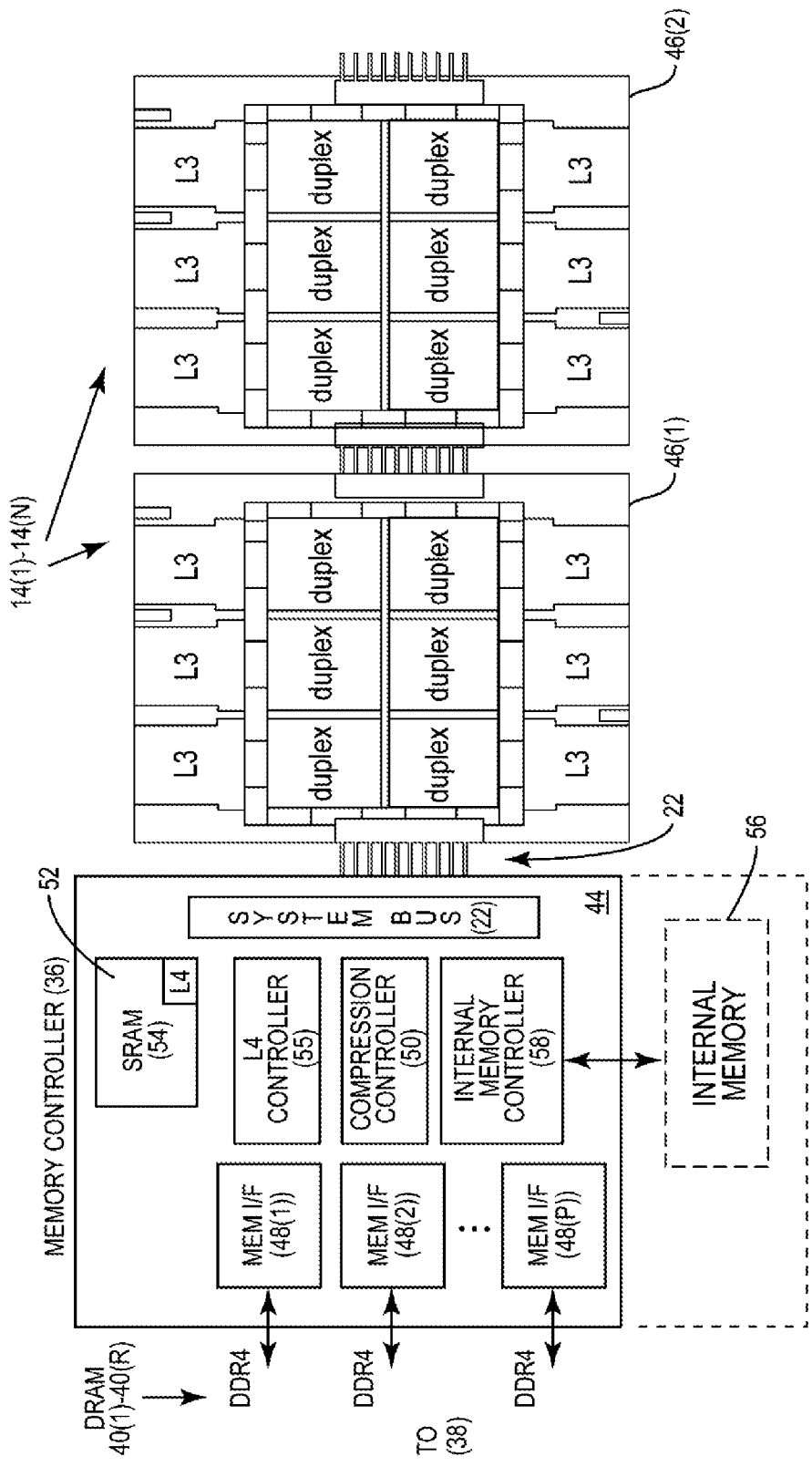
FIG. 3 is a more detailed schematic diagram of the memory controller of FIG. 2, wherein the memory controller is further communicatively coupled to an optional, internal memory that may be employed to provide memory bandwidth compression.

Before discussing exemplary dual in-line memory modules (DIMMs) that support storage of a data indicator(s) in an error correcting code (ECC) storage unit dedicated to storing an ECC, an exemplary central processing unit (CPU)-based system that includes a memory system is first discussed with regard to FIGS. 2 and 3. As discussed therein, a data indicator is provided and associated with each data word in memory that can be written by a memory controller. As a non-limiting example, the data indicator may be used to indicate if the memory controller compressed the written data word during a write operation. The data indicator can also be read and used by the memory controller. For example, if the data indicator is used to indicate if a data word is stored compressed or not compressed, the memory controller may use the data indicator to determine if a read data word for a read operation was previously stored compressed, so that the read data word can be uncompressed. Note that the aspects discussed herein of DIMMs that support storage of a data indicator(s) in an ECC storage unit dedicated to storing an ECC are not limited to storing data indicators to indicate data compression.

In this regard, FIG. 2 is a schematic diagram of an SoC 10' that includes an exemplary CPU-based system 12' having a plurality of CPU blocks 14(1)-14(N) similar to the CPU-based system 12 in FIG. 1. The CPU-based system 12' in FIG. 2 includes some common components with the CPU-based system 12 in FIG. 1, which are noted by common element numbers between FIGS. 1 and 2. For the sake of brevity, these elements will not be re-described. However, in the CPU-based system 12' in FIG. 2, a memory controller 36 is provided. The memory controller 36 controls access to a system memory 38. The system memory 38 may comprise one or more double data rate (DDR) dynamic random access memories (DRAMs) 40(1)-40(R) (referred to hereinafter as "DRAM 40(1)-40(R)"), as a non-limiting example. The memory controller 36 in this example employs memory bandwidth compression according to the aspects disclosed herein and below. Similar to the memory controller 24 of the CPU-based system 12 of FIG. 1, the memory controller 36 in the CPU-based system 12' in FIG. 2 is shared by the CPU blocks 14(1)-14(N) through the internal system bus 22.

To illustrate a more detailed schematic diagram of exemplary internal components of the memory controller 36 in FIG. 2, FIG. 3 is provided. In this example, the memory controller 36 is provided on a separate semiconductor die 44 from semiconductor dies 46(1), 46(2) that contain the CPU blocks 14(1)-14(N) in FIG. 2. Alternatively, in some aspects the memory controller 36 may be included in a common semiconductor die (not shown) with the CPU blocks 14(1)-14(N). Regardless of the die configurations, the memory controller 36 is provided such that the CPU blocks 14(1)-14(N) may make memory access requests via the internal system bus 22 to the memory controller 36, and receive data from memory through the memory controller 36.

With continuing reference to FIG. 3, the memory controller 36 controls operations for memory accesses to the system memory 38, which is shown in FIGS. 2 and 3 as comprising DRAM 40(1)-40(R). The memory controller 36 includes a plurality of memory interfaces (MEM I/Fs) 48(1)-48(P) (e.g., DDR DRAM interfaces) used to service memory access requests (not shown). In this regard, the memory controller 36 in this example includes a compression controller 50. The compression controller 50 controls compressing data stored to the system memory 38 and decompressing data retrieved from the system memory 38 in response to memory access requests from the CPU blocks 14(1)-14(N) in FIG. 2. In this manner, the CPU blocks 14(1)-14(N) can be provided with a virtual memory address space greater than the actual capacity of memory accessed by the memory controller 36. The compression controller 50 can also be configured to perform bandwidth compression of information provided over the internal system bus 22 to the CPU blocks 14(1)-14(N).

As will be discussed in more detail below, the compression controller 50 can perform any number of compression techniques and algorithms to provide memory bandwidth compression. A local memory 52 is provided for data structures and other information needed by the compression controller 50 to perform such compression techniques and algorithms. In this regard, the local memory 52 is provided in the form of a static random access memory (SRAM) 54. The local memory 52 is of sufficient size to be used for data structures and other data storage that may be needed for the compression controller 50 to perform compression techniques and algorithms. The local memory 52 may also be partitioned to contain a cache, such as a Level 4 (L4) cache, to provide additional cache memory for internal use within the memory controller 36. Thus, an L4 controller 55 may also be provided in the memory controller 36 to provide access to the L4 cache. Enhanced compression techniques and algorithms may require a larger internal memory, as will be discussed in more detail below. For example, the local memory 52 may provide 128 kilobytes (kB) of memory.

Further, as shown in FIG. 3 and as will be described in more detail below, an optional additional internal memory 56 can also be provided for the memory controller 36. The additional internal memory 56 may be provided as DRAM, as an example. As will be discussed in more detail below, the additional internal memory 56 can facilitate additional or greater amounts of storage of data structures and other data than in the local memory 52 for the memory controller 36 providing memory compression and decompression mechanisms to increase the memory bandwidth compression of the CPU-based system 12'. An internal memory controller 58 is provided in the memory controller 36 to control memory accesses to the additional internal memory 56 for use in compression. The internal memory controller 58 is not accessible or viewable to the CPU blocks 14(1)-14(N).

As noted above, the memory controller 36 in FIG. 3 may perform memory bandwidth compression, including, in some aspects, zero-line compression. The local memory 52 can be used to store larger data structures used for such compression. As discussed in greater detail below, memory bandwidth compression may reduce memory access latency and allow more CPUs 16(1), 16(2) or their respective threads to access a same number of memory channels while minimizing the impact to memory access latency. In some aspects, the number of memory channels may be reduced while achieving similar latency results compared to a greater number of memory channels if such compression was not performed by the memory controller 36, which may result in reduced system level power consumption.

Each of the resources provided for memory bandwidth compression in the memory controller 36 in FIG. 3, including the local memory 52 and the additional internal memory 56, can be used individually or in conjunction with each other to achieve the desired balance among resources and area, power consumption, increased memory capacity through memory capacity compression, and increased performance through memory bandwidth compression. Memory bandwidth compression can be enabled or disabled, as desired. Further, the resources described above for use by the memory controller 36 can be enabled or disabled to achieve the desired tradeoffs among memory capacity and/or bandwidth compression efficiency, power consumption, and performance. Exemplary memory bandwidth compression techniques using these resources available to the memory controller 36 will now be discussed.

One or more ECC bits may be included in a memory, such as in the CPU-based system 12 in FIG. 1, to perform ECC operations. However, it may also be desired to store at least one data indicator in association with a memory line for any number of reasons or purposes. For example, if a memory controller CPU-based system 12 is capable of performing data compression of stored data, the data indicator may be used to indicate whether the memory line is stored in compressed form or not. In this manner, when performing a memory access request to the system memory, a memory controller can check the data indicator associated with the memory line corresponding to the physical address to be addressed to determine if the memory line is compressed as part of processing of the memory access request. As another non-limiting example, a data indicator stored in memory in association with a stored data word may be used for cache coherency to indicate whether the stored data is present in another memory in a CPU-based system. However, providing data indicators for memory lines in memory increases memory size. Also, if it is desired to read the data indicator in the same burst as the data at a given data address, the memory data bus width between the memory controller and the memory may have to be increased, which may be undesirable, or latency may be increased.

Figure 4:
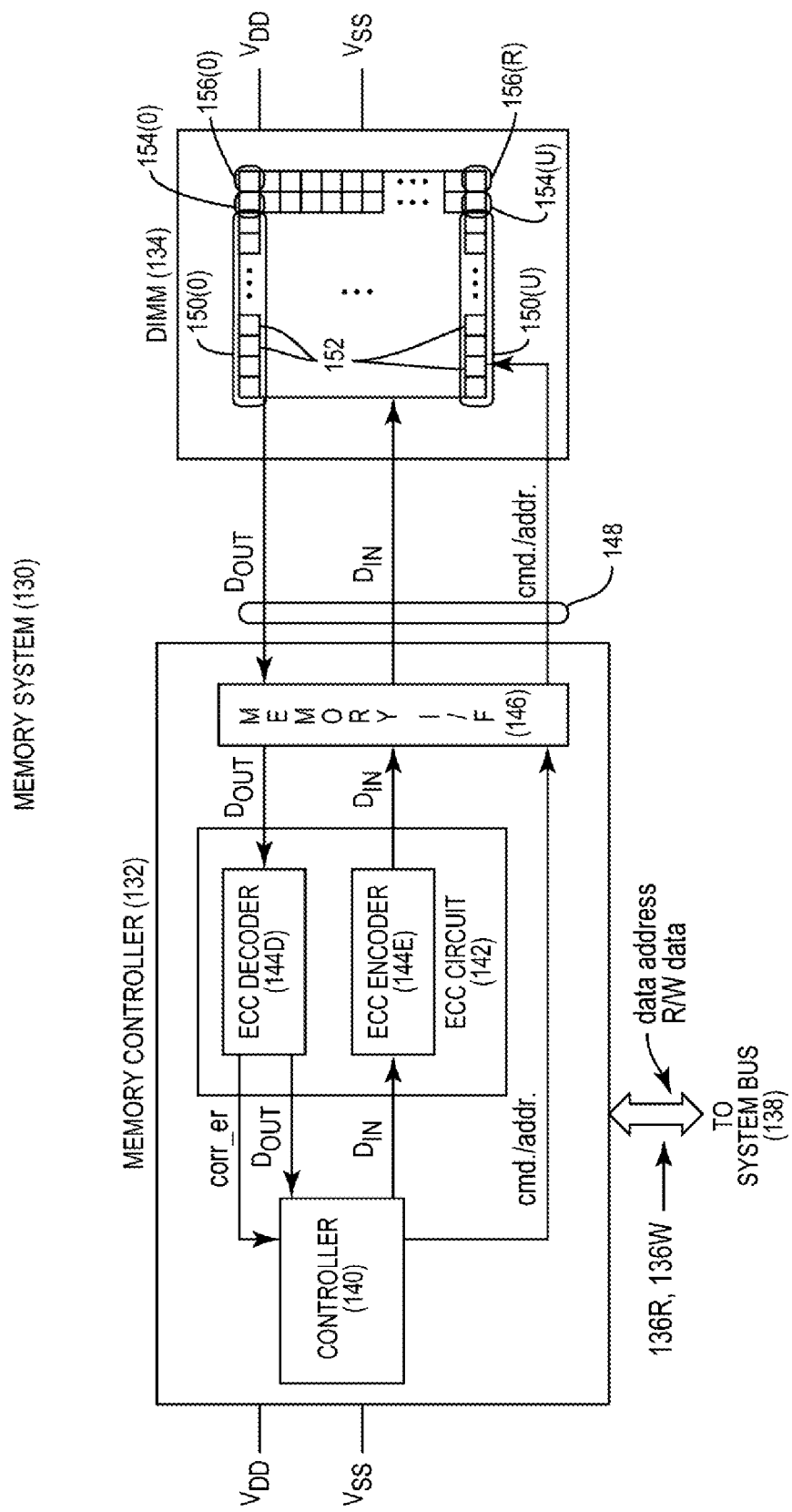
FIG. 4 is an exemplary memory system that includes a memory controller, which may be the controller in FIG. 2, a dual in-line memory module (DIMM) supporting storage of a data indicator(s) in an error correcting code (ECC) storage unit dedicated to storing an ECC.

In this regard, FIG. 4 is an exemplary memory system 130 that includes a memory controller 132, which may be the memory controller 36 in FIG. 2 as an example. The memory system 130 can be provided in a CPU-based system, including the CPU-based system 12' discussed above and illustrated in FIG. 2. A DIMM 134 is provided to store memory data. The memory controller 132 and DIMM 134 are typically powered in the same voltage domain (shown as Vdd and Vss in FIG. 4). The memory controller 132 is communicatively coupled to the DIMM 134 to provide memory access requests for read and write operations to the DIMM 134. The memory controller 132 is configured to receive memory read requests 136R and memory write requests 136W over a system bus 138. A memory read request 136R includes a read data address to be read in the DIMM 134. A memory write request 136W includes a write data address and write data to be written at the write data address in the DIMM 134. For memory write requests, if for example, the memory controller 132 is configured to determine if the write data can be compressed, the memory controller 132 can compress the write data to be stored in the DIMM 134 according to a compression algorithm. Similar to the examples discussed above, the memory controller 132 is configured to provide at least one data indicator to the DIMM 134 as part of a write operation so that the DIMM 134 can provide the at least one data indicator to the memory controller 132 during a read operation. For example, the data indicator may be used to indicate if the read data was stored compressed or uncompressed. As will be discussed in more detail below, the DIMM 134 is configured to support storage of at least one data indicator in an ECC storage unit dedicated to storing an ECC. In this manner, additional memory is not required to be provided to store the data indicator(s).

With continuing reference to FIG. 4, the memory controller 132 includes a controller 140, which may be similar to the compression controller 50 in the memory controller 36 in FIG. 3. The controller 140 is configured to receive write data for a memory write request 136W. Regardless, the write data is provided as a data input (Din) to an ECC circuit 142. The ECC circuit 142 includes an ECC encoder 144E that is configured to calculate an ECC word for the write data. The write data, the ECC word for the write data, and a data indicator set by the controller 140 is communicated through a memory interface (I/F) 146 over a memory bus 148 to the DIMM 134 to be stored in conjunction with each other. The controller 140 is configured to provide the command (e.g., write command) and data address (e.g., a write data address) as cmd/addr information along with the write data on the data input (Din) through the memory interface 146 to the DIMM 134. The memory interface 146 may be or may be similar to the memory interface 48 in the memory controller 36 in FIG. 3. Depending on the amount of data that can be transferred to the memory system 130 in one data burst (i.e., data burst length), the memory controller 132 may break up the write data into multiple burst write data words communicated to the DIMM 134 to be stored.

For example, as discussed in more detail below, the DIMM 134 in FIG. 4 may be seventy-two (72) bits wide. The DIMM 134 in FIG. 4 includes a plurality of data line storage units 150(0)-150(U) each comprising sixty-four (64) data bit cells 152. Multiple data line storage units 150(0)-150(U) may be partitioned in the DIMM 134 to provide a burst data storage unit. A burst data storage unit is a storage unit bit size in the DIMM 134 for a burst data transaction according to the burst data length. For example, a burst data length may be equal to the size of four (4) data line storage units 150(0)-150(U) in the DIMM 134, wherein each data line storage unit 150(0)-150(U) is a data byte storage unit comprising sixty-four (64) data bit cells 152. Thus, in this example, a data burst is 32 bytes (i.e., 64 bits in a data line storage unit 150 times 4 data lines). Also in this example, if the data word size for the memory system 130 is sixty-four (64) bytes, eight (8) data line storage units 150(0)-150(U) will be employed in the DIMM 134 to store this data word totaling 64 bytes, which is provided in two data bursts of 32 bytes each.

With continuing reference to FIG. 4, an ECC line storage unit 154(0)-154(U) is also provided in the DIMM 134 for each data line storage units 150(0)-150(U). The ECC line storage units 154(0)-154(U) are configured to store one or more ECC words corresponding to a data word striped over one or more data line storage units 150(0)-150(U) in the DIMM 134. Thus, as will be discussed in more detail below, the DIMM 134 is configured to stripe a calculated ECC for write data over the plurality of ECC line storage units 154(0)-154(U), if a burst data word is larger than the size of a single data line storage unit 150. As discussed above, in this example, a burst data word is 32 bytes and thus an ECC code for a data word can be striped by the DIMM 134 over 32 bits over four (4) ECC line storage units 154(0)-154(U) of eight (8) bits each (i.e., 32 bits) corresponding to four (4) data line storage units 150(0)-150(U).

With continuing reference to FIG. 4, a plurality of data indicator units 156(0)-156(R) are provided in the DIMM 134 to provide a storage unit to store a data indicator that can be used to provide an indication about stored data words. Because as discussed below, the data indicator units 156(10)-156(R) are provided as part of the ECC line storage units 154(0)-154(U) based on the ECC bit error correction code selected for use, additional bits of storage are not required in the DIMM 134 to store the data indicator units 156(0)-156(R). Also, the number of data indicator units 156(0)-156(R) may differ from the number of data line storage units 150(0)-150(U) if the data burst length is such that stored data words are larger than the size of the data line storage units 150(0)-150(U) in the DIMM 134, because only one data indicator unit 156 is needed for each single data word. At a minimum, each data indicator unit 156(0)-156(R) can consist of one (1) bit to store a data indicator that simply indicates one of two states about the corresponding stored data word. If the memory controller 132 is configured to determine more than two states about the write data, the data indicator units 156(0)-156(R) can be configured to store multiple bits to also allow storage of multiple data indicators for given data word to be encoded and stored in the DIMM 134 in association with the given data word.

With continuing reference to FIG. 4, the controller 140 is also configured to receive a memory read request 136R comprising a read data address over the system bus 138 to perform a read operation. In this regard, the controller 140 provides the read operation and the read data address to the DIMM 134 through the cmd/addr information for the read data to be accessed by the DIMM 134 at the read address. The DIMM 134 provides the read data, the ECC associated with the read data, and the at least one data indicator associated with the read data as output data (Dout) to the memory interface 146 of the memory controller 132. The ECC associated with the read data is provided to an ECC decoder 144D in the ECC circuit 142 to determine if the read data contains a bit error(s). The ECC decoder 144D corrects any detected bit error(s), if possible, depending on the ECC bit error correction code employed by the memory controller 132. The bit error(s) is communicated to the controller 140 as a correction error signal (corr_er). As a non-limiting example, the controller 140 can use the received data indicator(s) to determine if the read data is compressed or uncompressed. If compressed, the controller 140 decompresses the read data to provide the read data on the system bus 138 to the requestor that issued the memory read request 136R.

Figure 5:
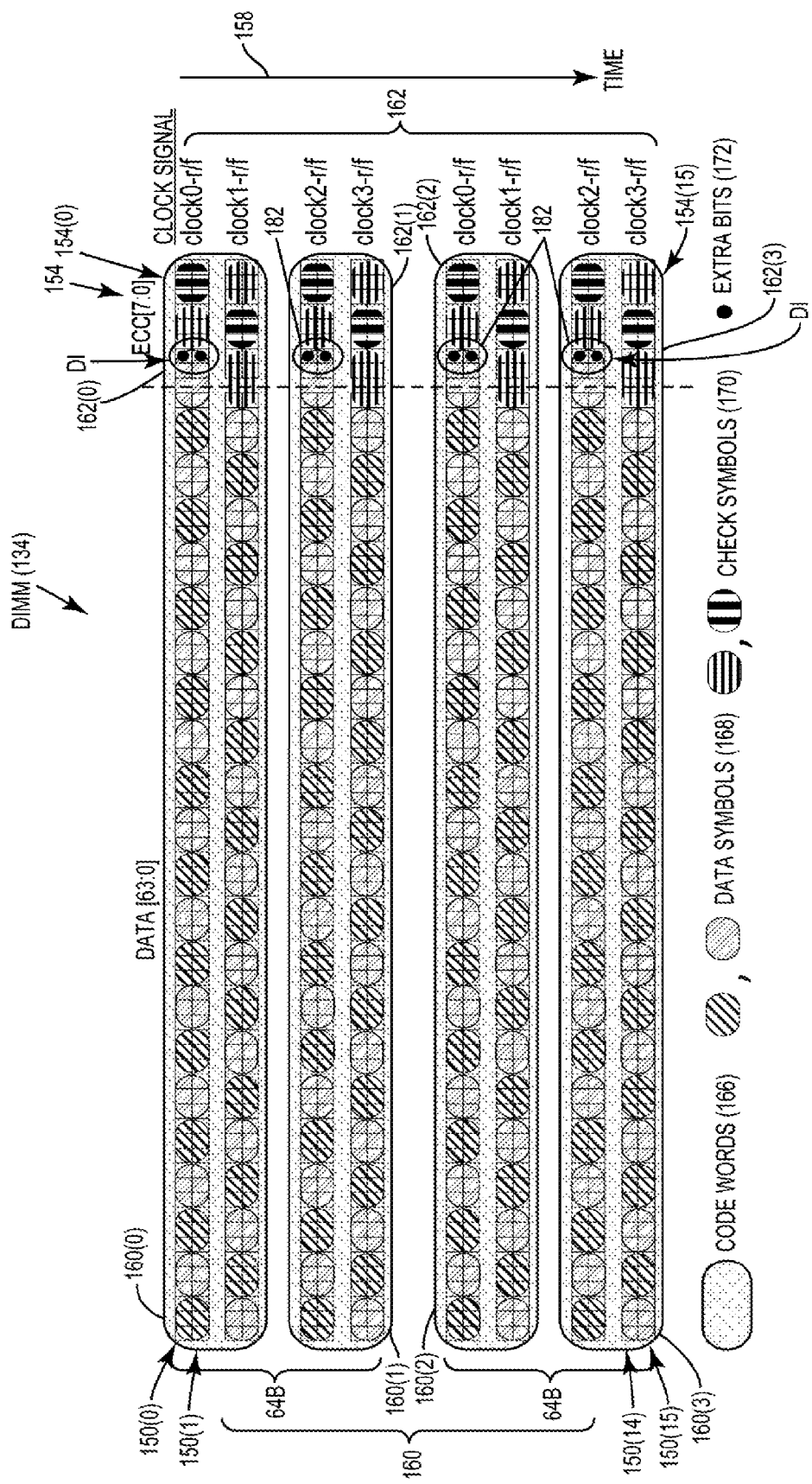
FIG. 5 is a diagram of an exemplary data partitioning of data line storage units in a DIMM into burst data storage units each comprising a burst data word storage unit striped over a plurality of data line storage units for storing a burst data word, and a burst ECC word for the burst data word striped across a burst ECC storage unit in fewer bits than a number of data bit cells in the burst ECC storage unit, to provide additional, extra bits to store at least one data indicator.

FIG. 5 is a diagram of an exemplary data partitioning of the data line storage units 150(0)-150(U) in the DIMM 134 of the memory system 130 in FIG. 4 to illustrate an example of storing data indicators as part of an ECC line storage unit 154. In this regard, as shown in FIG. 5, the DIMM 134 is partitioned into a plurality of burst data storage units 160(0)-160(3). Four (4) burst data storage units 160(0)-160(3) of the DIMM 134 are shown in FIG. 5, which may be the size of a cache line for example (i.e., 256 bytes). In this example, as discussed above, the burst length is four (4) meaning that each burst data storage unit 160(0)-160(3) is comprised of four (4) data line storage units 150(0)-150(3) to allow for a burst data word stored therein to be thirty-two (32) bytes in length. In this example, only sixteen (16) data line storage units 150(0)-150(15) are shown in the DIMM 134, because only four (4) burst data storage units 160(0)-160(3) are shown. As discussed above, in this example, a data word in a CPU-based system in which the memory system 130 in FIG. 4 is provided is sixty-four (64) bytes, so each data word can be stored as two (2) burst data words in two (2) burst data storage units 160(0)-160(1) each able to store thirty-two (32) bytes each. Thus, in this example, each burst data word storage unit 160 is striped over four (4) data line storage units 150(0)-150(3) totaling the burst length, with each data line storage unit 150 each comprising sixty-four (64) data bit cells. Also as shown in FIG. 5, the DIMM 134 is double data rate (DDR) clocked meaning that the DIMM 134 is clocked on both the rising and falling edge of a clock signal. This is shown in the right hand side in FIG. 5, where a clock signal status is shown to explain how the data line storage units 150(0)-150(15) are accessed by the DIMM 134 sequentially over time, as shown by a time arrow 158. For example, the data line storage unit 150(0) is accessed on the rising edge of the clock signal in cycle '0' (i.e., clock0-r). The data line storage unit 150(1) is accessed on the falling edge of the clock signal in cycle '0' (clock0-f), and so on.

With continuing reference to FIG. 5, the DIMM 134 is also partitioned into a plurality of burst ECC storage units 162 that are each capable of storing a burst ECC word. Four (4) burst ECC storage units 162(0)-162(3) of the DIMM 134 are shown in FIG. 5, wherein each burst ECC storage unit 162(0)-162(3) is associated with a respective burst data storage unit 160(0)-160(3). In this example, as discussed above, the burst length is four (4) meaning that each burst ECC storage unit 162(0)-162(3) is comprised of four (4) ECC line storage units 154(0)-154(3) to provide for each burst ECC word to be thirty-two (32) bits in length, since each ECC line storage unit 154 is comprised of eight (8) data bits. In this example, only sixteen (16) ECC line storage units 154(0)-154(15) are shown in the DIMM 134, because only four (4) burst data storage units 160(0)-160(3) are shown. As discussed above, in this example, a data word in the CPU-based system in which the memory system 130 in FIG. 4 is provided is sixty-four (64) bytes, so each data word is comprised of two (2) burst data storage units 150(0)-150(1) each able to store thirty-two (32) bytes each. Thus, in this example, each burst ECC storage unit 162 is striped over four (4) ECC line storage units 154(0)-154(3) totaling the burst length, with each ECC line storage unit 154 each comprising eight (8) data bit cells to allow for a total of thirty-two (32) ECC bits to be stored as a burst ECC word for a burst data word.

In this example, to allow for a data indicator(s) to be stored in a burst ECC storage unit 162 for a given burst data word stored in the burst data storage unit 160, an ECC bit error correction code is chosen that provides for an ECC bit size to be less than thirty-two (32) bits for each burst data word. However, it is also desired that the chosen ECC bit error correction code be able to provide a highly capable bit error detection and correction scheme, where possible, to maintain the integrity of data words stored in the DIMM 134. In this regard, an example of such an ECC bit error correction code that can employed by the memory controller 132 for use in storing data in the DIMM 134 is the Reed-Solomon (RS) bit error correction code (hereinafter "RS code"). The RS code is a known ECC bit error correction code that can be employed according to the partition of the DIMM 134 shown in FIG. 5.

For example, as shown in FIG. 5, an RS code of {48, 43} with a hamming distance of six (6) is employed by the memory controller 132. In this regard, each burst data storage unit 160 and associated burst ECC storage unit 162 comprises a code word 166 capable of storing forty-eight (48), six (6) bit symbols. Forty-three (43) of the forty-eight (48) symbols are bit symbols in the form of data symbols 168 used for storing a burst data word (i.e., 258 bits=43 symbols×6 bits each). Five (5) of the forty-eight (48) symbols are bit symbols in the form of check symbols 170 used for storing a burst ECC word (i.e., 30 bits=5 symbols×6 bits each). The RS code of {48, 43} with a hamming distance of six (6) can be configured to allow the memory controller 132 to correct a single or two (2) data symbols 168/check symbols 170 errors per code word 166 and can detect errors in three (3) data symbols 168/check symbols 170 errors per code word 166. Alternately, the RS code can be configured to allow the memory controller 132 to correct a single (1)

data symbol 168/check symbol 170 errors per code word 166 and can detect errors in four (4) data symbols 168/check symbols 170 errors per code word 166. For example, if the memory system 130 in FIG. 4 is provided in a server environment, the DIMM 134 may be configured in 4-bit width DRAM chips. Thus, the ability to detect bit errors in multiple adjacent bit symbols (i.e., data symbols 168 and/or check symbols 170) may be useful for detecting common types of memory failures, as will be described in more detail below with regard to FIGS. 9-14.

Because the DIMM 134 is configured to store data line words of sixty-four (64) bits each and ECC line words of eight (8) bits each for a 72-bit width data line storage unit 150 and ECC line storage unit 154, and because the burst length is four (4), using this RS code provides for four (4) extra bits 172 to be left over (i.e., 72 bits×burst length of 4=288 bits; 288 bits−256 bits for burst data word−30 bits for burst ECC word=4 extra bits). In this regard, with this RS code, the burst ECC word for a burst data word can be striped across the burst ECC storage unit 162 in the DIMM 134 in fewer bits than a number of data bit cells in the burst ECC storage unit 162, to provide for the additional, unused extra bits 172. These extra bits 172, as shown in the DIMM 134 in FIG. 5 are thus unused, and thus can be used to store a data indicator(s) for the burst data word stored in a code word 166. One or more of the four (4) extra bits 172 per data word of sixty-four (64) bytes over two (2) code words 166 in the DIMM 134 can be used. For example, only one extra bit 172 is needed if the data indicator(s) is a simple indicator. If different sizes of data indicators are needed for a data word by the memory controller 132, the data indicator(s) may be encoded over multiple extra bits 172. For example, with four (4) extra bits 172 per data word in this example, fifteen (15) different states about the data word could be encoded.

Figure 6:
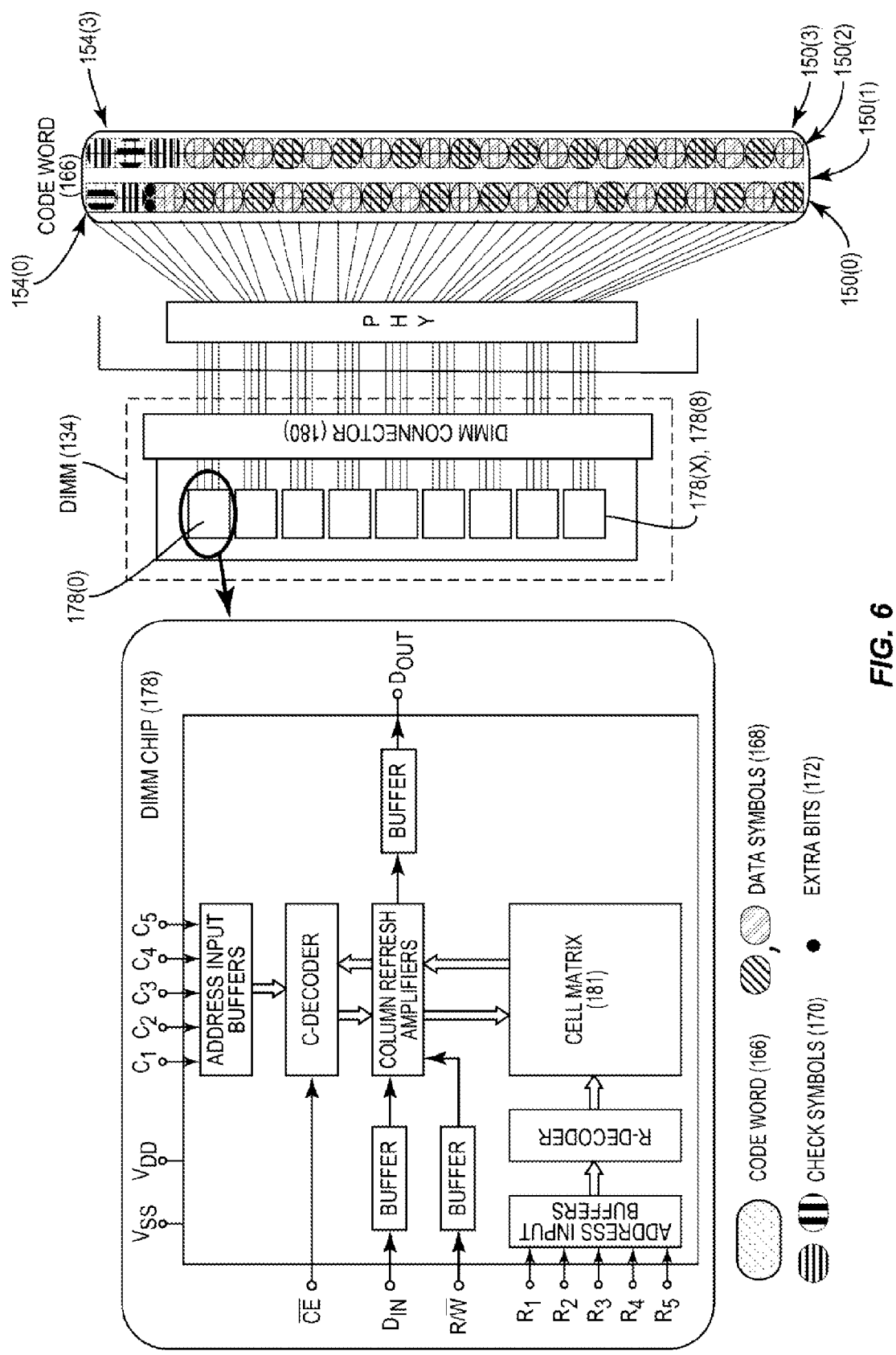
FIG. 6 is an exemplary DIMM that can be provided in the memory system in FIG. 4 to provide the data partitioning shown in FIG. 5.

FIG. 6 is a diagram illustrating more exemplary detail of the DIMM 134 that can be provided in the memory system 130 in FIG. 4 and partitioned for data storage by the memory controller 132 according to the data partitioning shown in FIG. 5. In this regard, the DIMM 134 is comprised of a plurality of DIMM chips 178(0)-178(X). In this example, nine (9) DIMM chips 178(0)-178(8) are included in the DIMM 134. A physical DIMM connector 180 is provided to interface the DIMM 134 and the DIMM chips 178(0)-178(8) therein to the memory bus 148 (see FIG. 4). Exemplary detail for one DIMM chip 178 is shown in FIG. 6. In this example, each DIMM chip 178(0)-178(8) is addressable in thirty-two (32) rows (R1-R5) and thirty-two (32) columns (C1-C5) to address sixteen (16) bits of striped data in two (2) adjacent rows of the DIMM 134 in a cell matrix 181. Thus, in this example, nine (9) DIMM chips 178(0)-178(8) can store 128 bits, which is two (2) data line storage units 150(0)-150(1). For a write operation, a write data word provided to the DIMM 134 is striped across the DIMM chips 178(0)-178(8) on data inputs (Din) for the DIMM chips 178(0)-178(8). A read/write (R/W) signal is provided to the DIMM chips 178(0)-178(8) as cmd/addr information from the memory controller 132 to indicate either a memory read operation 136R or a memory write operation 136W. For a memory read operation 136R, the access data stored in the DIMM chips 178(0)-178(8) is provided on respective data outputs (Dout) to be provided to the memory controller 132.

Figure 7A:
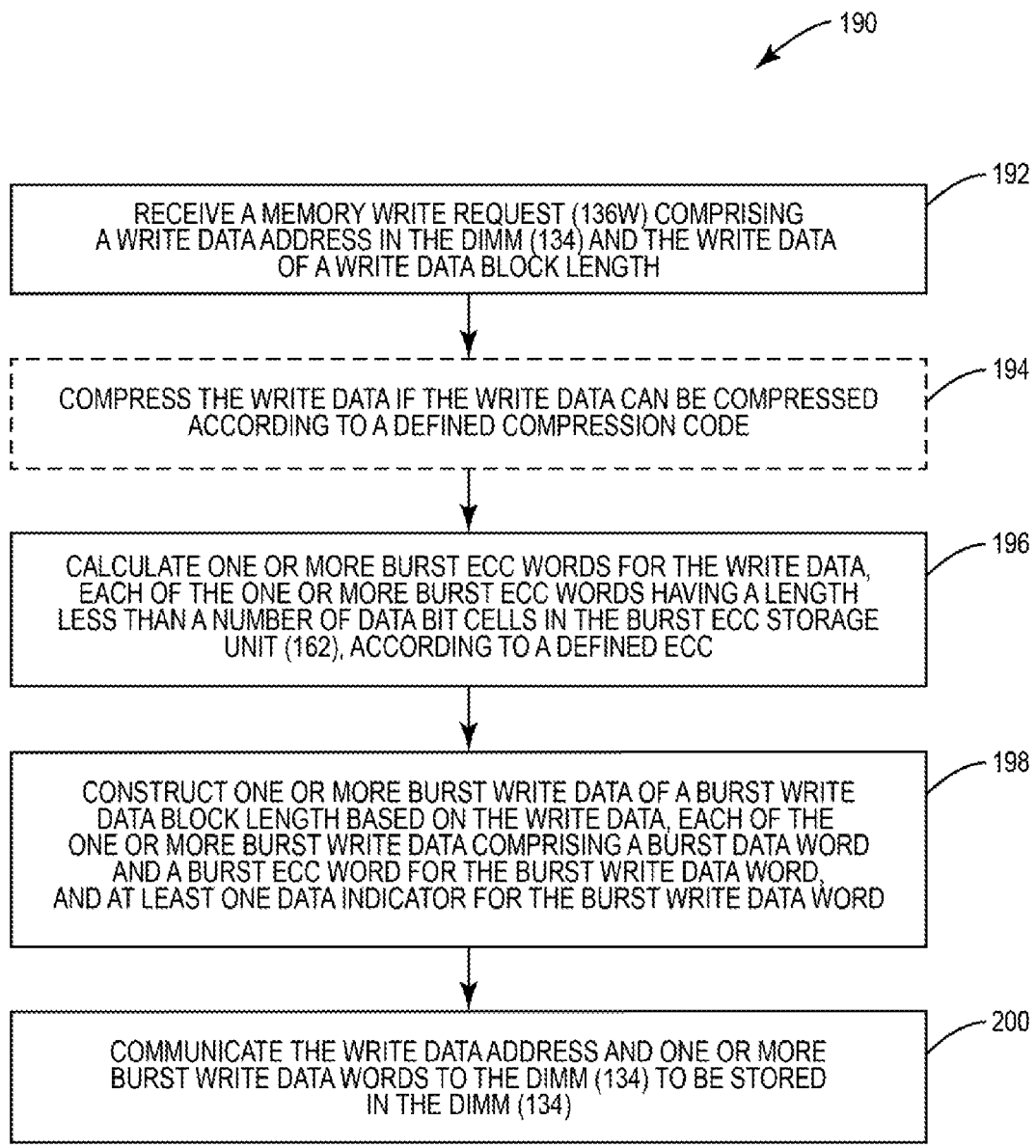
FIG. 7A is a flowchart illustrating an exemplary process of the memory controller in FIG. 4 processing a write operation to store a received data word in the DIMM compatible with the exemplary data partitioning of the DIMM in FIG. 5.
Figure 7B:
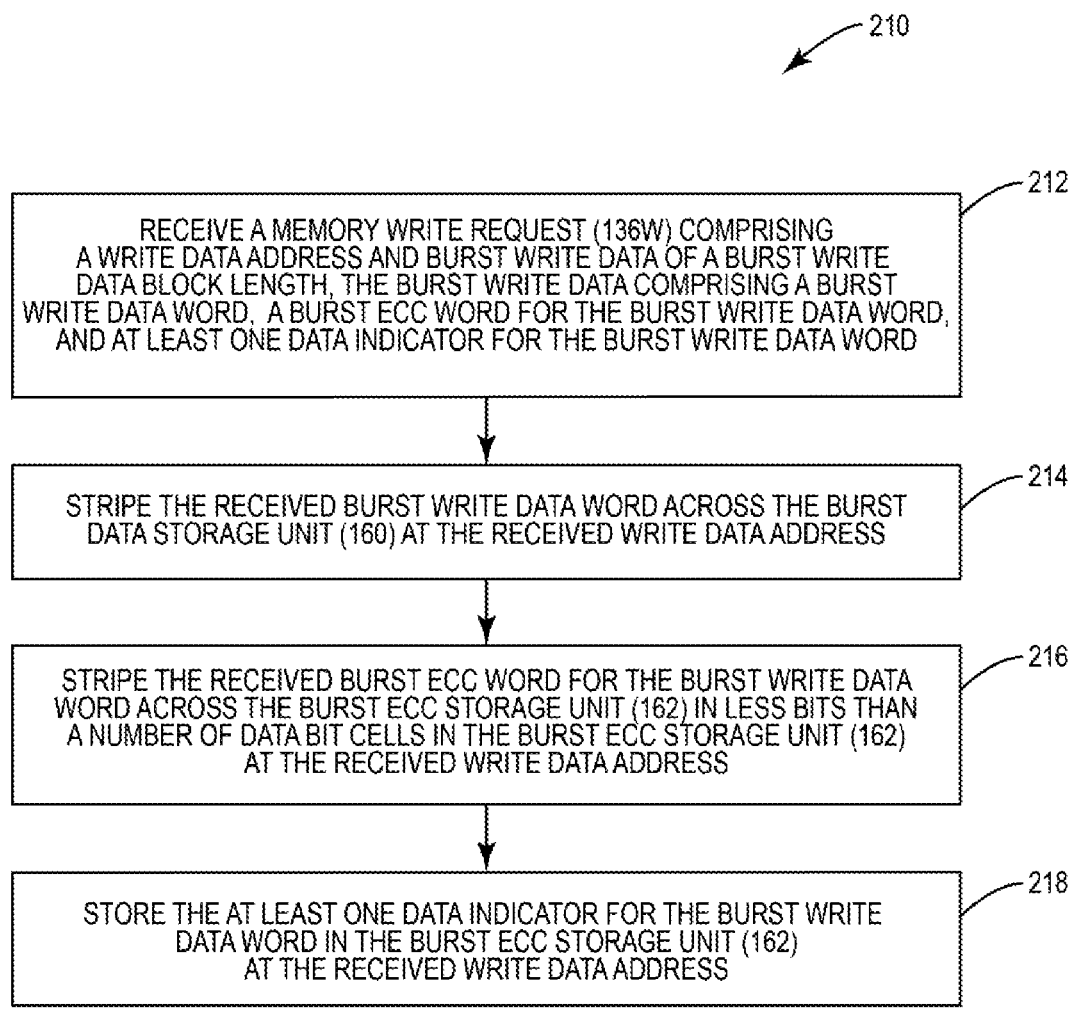
FIG. 7B is a flowchart illustrating an exemplary process of the DIMM in FIG. 4 striping a burst write data word and a burst ECC word for the burst write data word in a burst data storage unit along with a data indicator.

The memory controller 132 in FIG. 4 is configured to perform memory read and write operations in the DIMM 134 using a bit error correction code that allows for at least one extra bit(s) 172 to be provided for each data word stored therein. In this regard, FIG. 7A is a flowchart illustrating an exemplary process 190 of the memory controller 132 in FIG. 4 processing a write operation to store a received data word in the DIMM 134 compatible with the exemplary data partitioning of the DIMM 134 in FIG. 5. FIG. 7B is a flowchart illustrating an exemplary process 210 of the DIMM 134 in FIG. 4 striping a burst write data word and a burst ECC word for the burst write data word in a burst data storage unit 160 and burst ECC storage unit 162 along with a data indicator(s).

With reference to FIG. 7A, the process 190 starts by the memory controller 132 in FIG. 4 receiving a memory write request 136W comprising the write data address and the write data of a write data block length (block 192). For example, if the memory controller 132 is configured to compress write data and use a data indicator to indicate whether write data is stored in compressed or uncompressed form, the memory controller 132 may optionally compress the write data if the write data can be compressed according to a defined compression code (block 194). The memory controller 132 then calculates one or more burst ECC words for the write data, each of the one or more burst ECC words having a length less than a number of data bit cells in the burst ECC storage unit 162 in the DIMM 134, according to a defined ECC (block 196). The memory controller 132 then constructs one or more burst write data of a burst write data block length based on the write data, each of the one or more burst write data comprising a burst write data word and a burst ECC word for the burst write data word, and at least one data indicator for the burst write data word (block 198). The memory controller 132 then communicates the write operation and write data address as cmd/addr information and the one or more burst write data words as input data (Din) to the DIMM 134 to be stored at the write data address in the DIMM 134 (block 200).

With reference to FIG. 7B, for a memory write request 136W from the memory controller 132, the process 210 in the DIMM 134 involves receiving the write data address for the memory write request 136W from the memory controller 132 (block 212). The DIMM 134 receives burst write data of a burst write data block length for the memory write request 136W, the burst write data comprising a burst write data word, a burst ECC word for the burst write data word, and at least one data indicator for the burst write data word. The DIMM 134 then stripes the received burst write data word across the burst data storage unit 160 at the received write data address (block 214). The DIMM 134 also stripes the received burst ECC word for the burst write data word across the burst ECC storage unit 162 in fewer bits than a number of data bit cells in the burst ECC storage unit 162, in the burst data storage unit 160 at the received write data address (block 216). The DIMM 134 stores the at least one data indicator for the burst write data word in the burst ECC storage unit 162 at the received write data address (block 218).

Figure 8A:
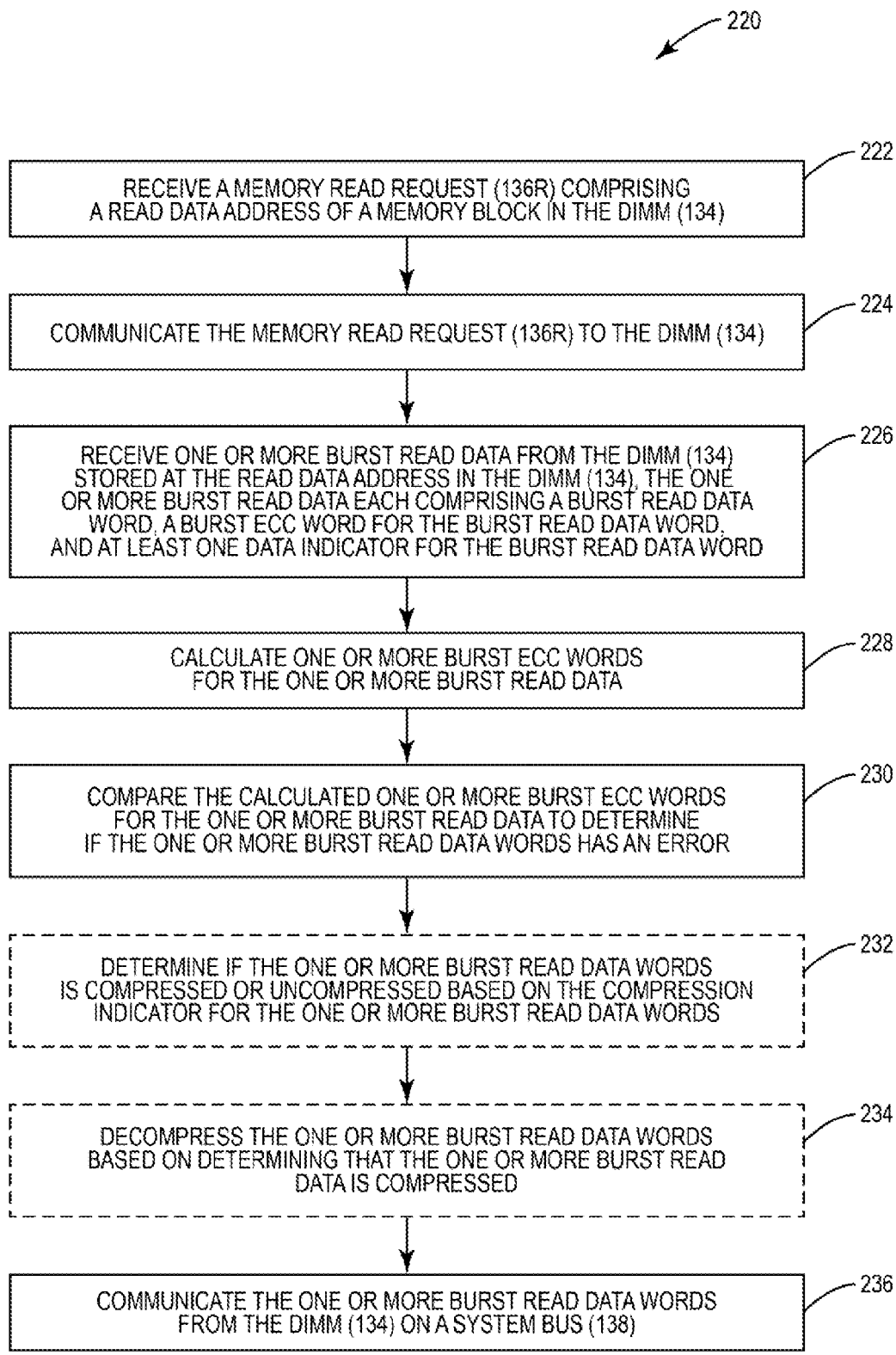
FIG. 8A is a flowchart illustrating an exemplary process of the memory controller in FIG. 4 processing a read operation to request and a receive a read data word from the DIMM compatible with the exemplary data partitioning of the DIMM in FIG. 5.
Figure 8B:
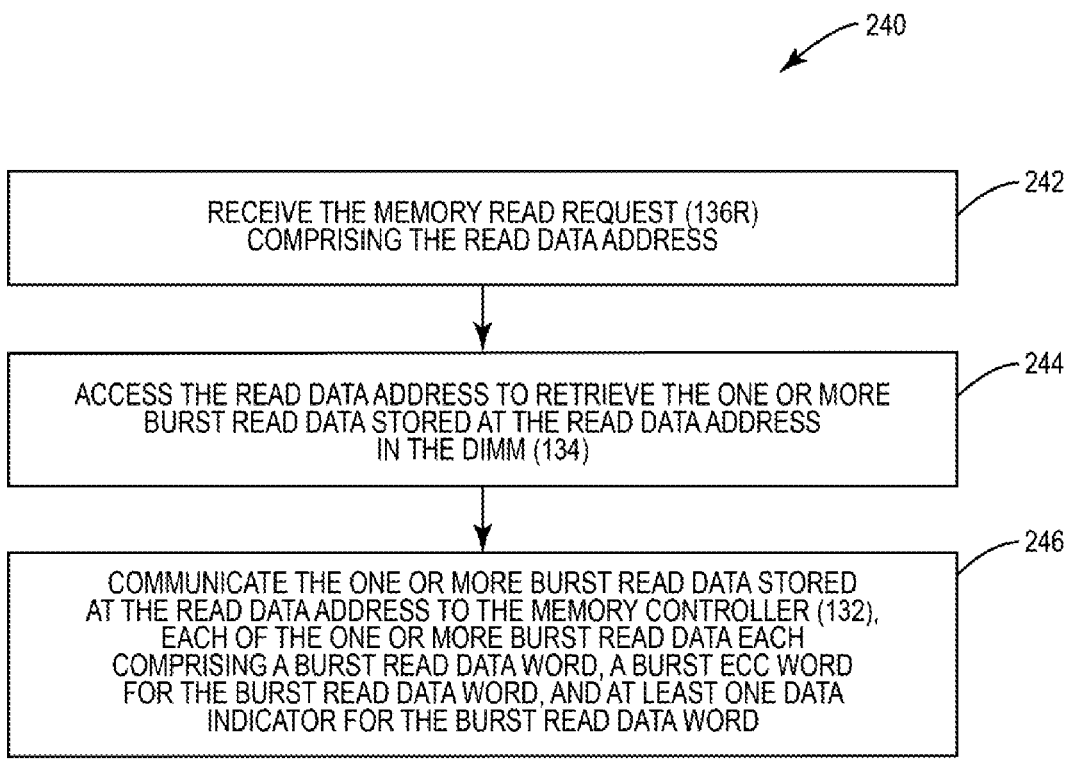
FIG. 8B is a flowchart illustrating an exemplary process of the DIMM in FIG. 4 accessing a burst read data word and a burst ECC word for the burst read data word in a burst data storage unit along with a data indicator.

FIG. 8A is a flowchart illustrating an exemplary process 220 of the memory controller 132 in FIG. 4 processing a read operation to request and a receive a read data word from the DIMM 134 compatible with the exemplary data partition of the DIMM 134 in FIG. 5. FIG. 8B is a flowchart illustrating an exemplary process 240 of the DIMM 134 in FIG. 4 accessing a burst read data word and a burst ECC word for the burst read data word in a burst data storage unit 160 along with a data indicator(s).

In this regard, as shown in FIG. 8A, the process 220 for a memory read operation in the memory controller 132 starts by the memory controller 132 receiving a memory read request 136R comprising a read data address of a memory block in the DIMM 134 (block 222). The memory controller 132 then communicates the memory read request 136R to the DIMM 134 by providing the read operation and read data address as cmd/addr information to the DIMM 134, as shown in FIG. 4 (block 224). After the DIMM 134 processes the read operation (discussed below in FIG. 8B), the DIMM 134 communicates back the burst read data from the DIMM 134 to the memory controller 132. The memory controller 132 receives one or more burst read data from the DIMM 134 stored at the read data address in the DIMM 134 (block 226). The one or more burst read data each comprise a burst read data word, a burst ECC word for the burst read data word, and a data indicator(s) for the burst read data word. The memory controller 132 then calculates one or more burst ECC words for the one or more received burst read data for a read data word to perform error detection and correction, if necessary (block 228). The memory controller 132 compares the calculated one or more burst ECC words for the one or more burst read data to determine if the one or more burst read data words has an error(s), which may be correctable and corrected (block 230). For example, if the memory controller 132 is configured to perform data compression and use the data indicator(s) to indicate whether data is stored in compressed or uncompressed form, the memory controller 132 can optionally be configured to determine if the one or more burst read data words is compressed or uncompressed based on the data indicator(s) received for the one or more burst read data words (block 232). In this example, the memory controller 132 can be configured to optionally decompress the one or more burst read data words if the data indicator(s) indicates that the one or more burst read data words are compressed (block 234). The memory controller 132 then communicates the one or more burst read data words from the DIMM 134 onto the system bus 138 (block 236).

As shown in FIG. 8B, when the DIMM 134 receives the memory read request 136R from the memory controller 132 that contains the read data address (block 242), the DIMM 134 accesses the data word stored at the read data address (block 244). The DIMM 134 retrieves one or more burst read data stored at the read data address in the DIMM 134 (block 244). The DIMM 134 then communicates the one or more burst read data stored at the read data address to the memory controller 132 (block 246). Each of the one or more burst read data comprises a burst read data word, a burst ECC word for the burst read data word, and at least one data indicator for the burst read data word.

Figure 9:
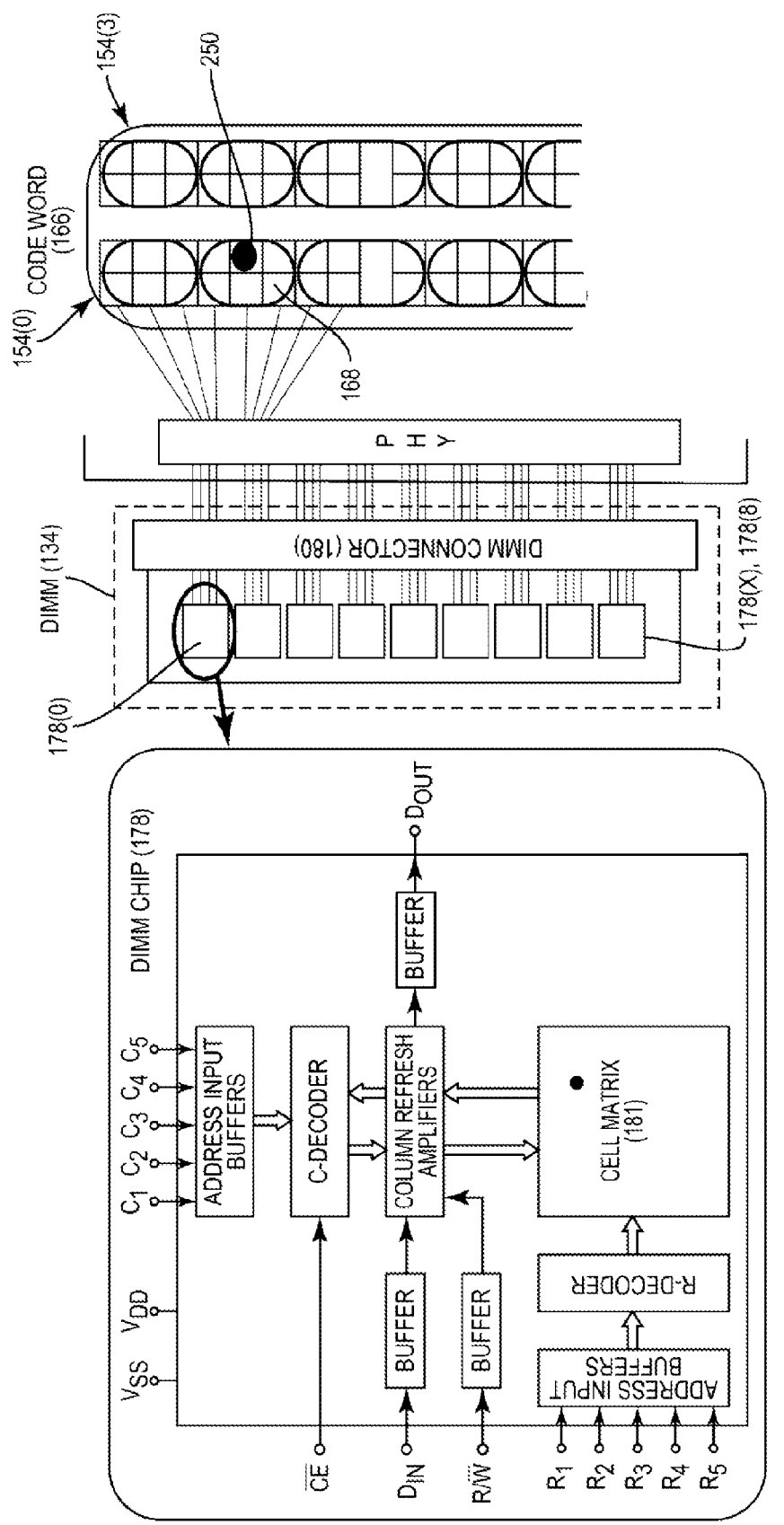
FIG. 9 is a diagram of the DIMM in FIG. 6 according to the exemplary data partition in FIG. 5 illustrating an exemplary single memory bit cell failure in a code word in the DIMM.

FIG. 9 is a diagram of the DIMM 134 in FIG. 6 according to the exemplary data partition in FIG. 5 illustrating an exemplary single memory bit cell 250 failure in a data symbol 168 of a code word 166. Thus, using the exemplary bit error correction code discussed above, the memory controller 132 can detect and correct this bit error as part of its ECC circuit 142 operation. Even if other bit errors were present in other data symbols 168 or check symbols 170, a single bit error in such other data symbols 168 or check symbols 170 could be detected and corrected.

Figure 10:
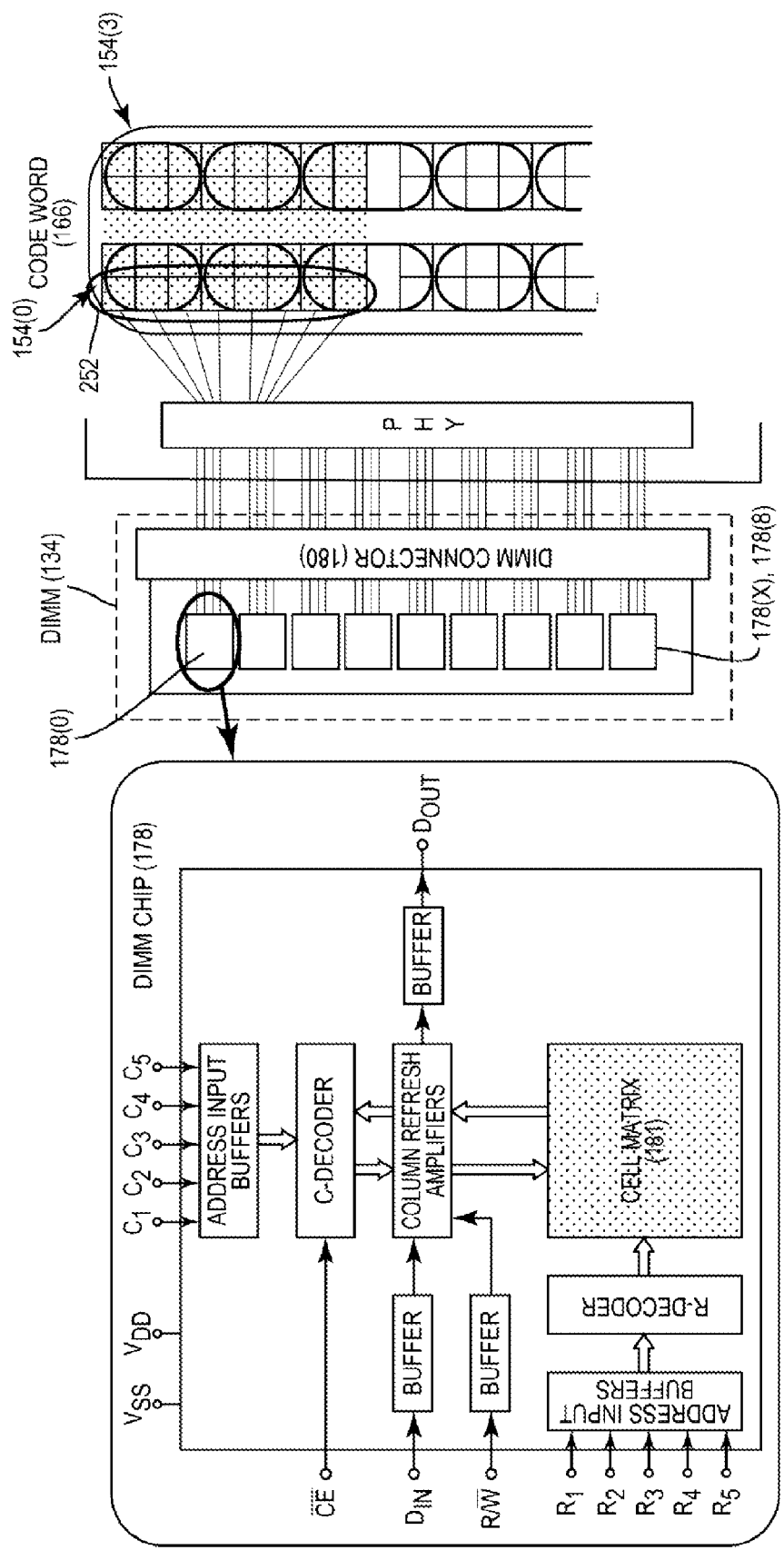
FIG. 10 is a diagram of the DIMM in FIG. 6 according to the exemplary data partition in FIG. 5 configured in eight (8) bit width and illustrating an exemplary memory bank or row failure.
Figure 11:
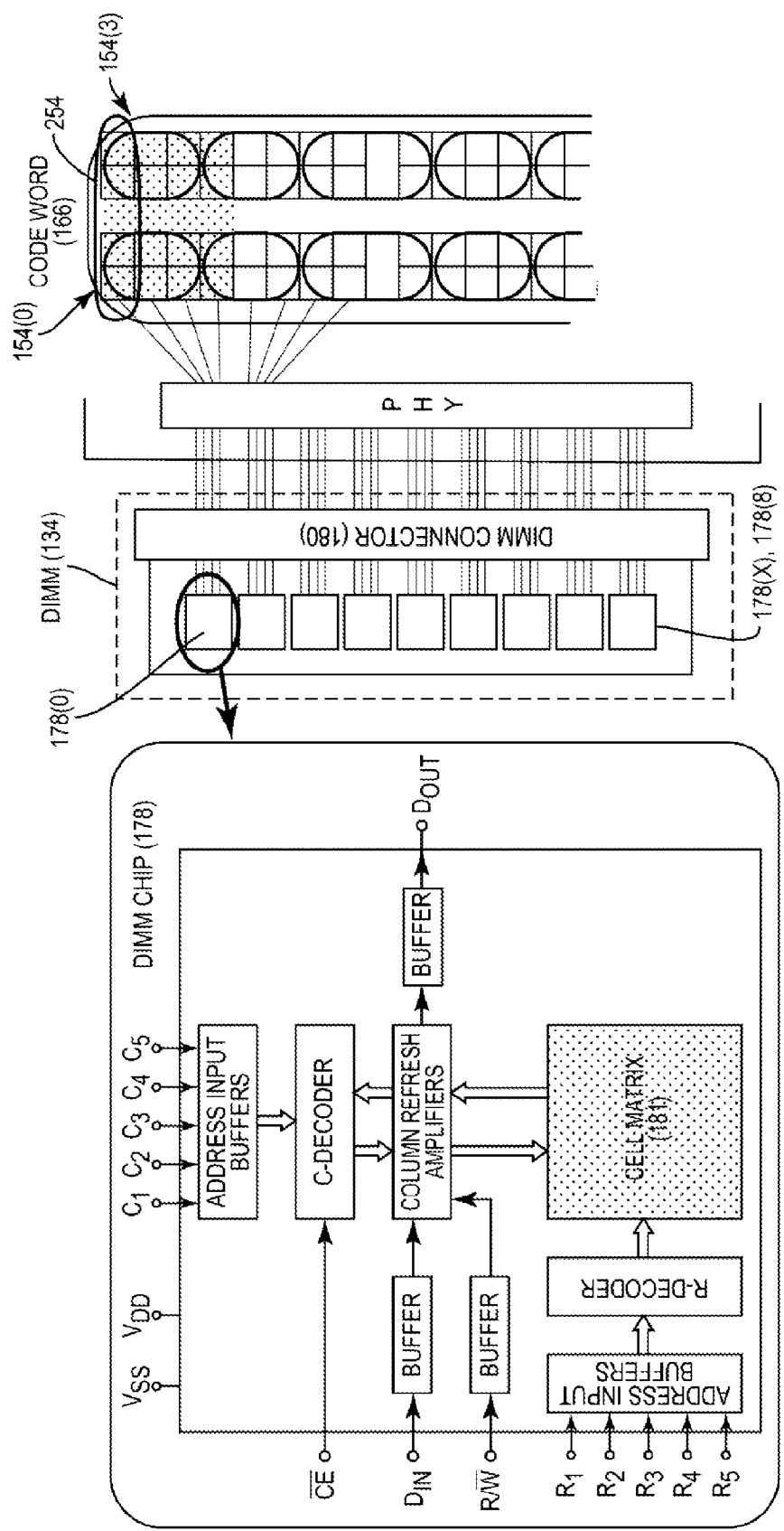
FIG. 11 is a diagram of the DIMM in FIG. 6 according to the exemplary data partition in FIG. 5 configured in four (4) bit width and illustrating an exemplary memory bank or row failure.

FIG. 10 is a diagram of the DIMM 134 in FIG. 6 according to the exemplary data partition in FIG. 5 configured in eight (8) bit width and illustrating an exemplary memory bank or row failure. In this regard, the code word 166 in FIG. 10 is shown as having a bit failure in a row or bank 252. A failed memory row or bank 252 will appear as having at least one bit error in at least three (3) adjacent data symbols 168 or check symbols 170, because a bit error in two (2) adjacent data symbols 168 or check symbols 170 could be a column or row failure with an eight (8) bit width. However, in the DIMM 134 in FIG. 11 configured in four (4) bit width, an exemplary memory bank or row failure 254 will appear in four (4) or more adjacent bit cells in adjacent data symbols 168 or check symbols 170 having a bit error.

Figure 12:
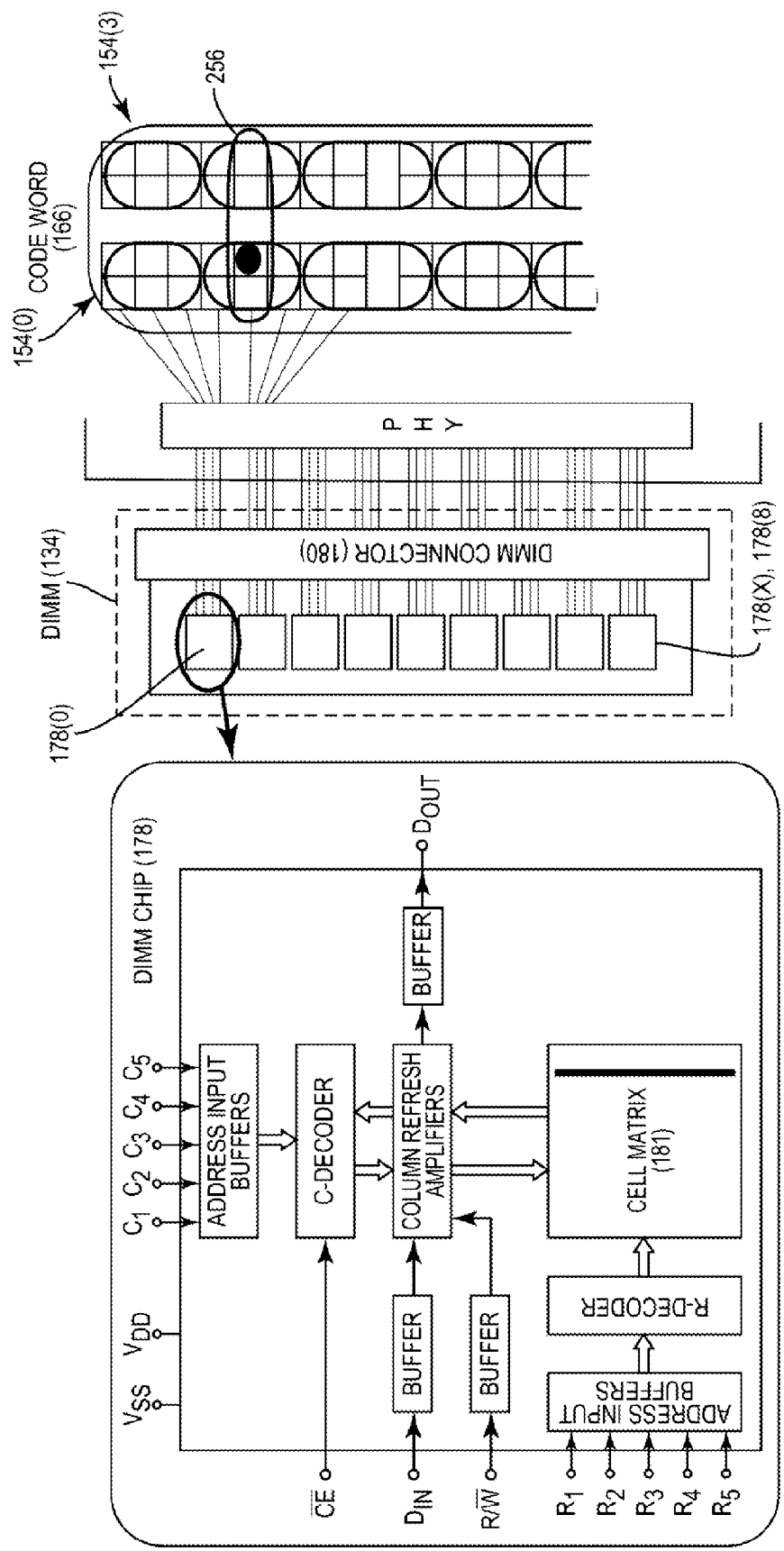
FIG. 12 is a diagram of the DIMM in FIG. 6 according to the exemplary data partition in FIG. 5 illustrating an exemplary memory column failure.
Figure 13:
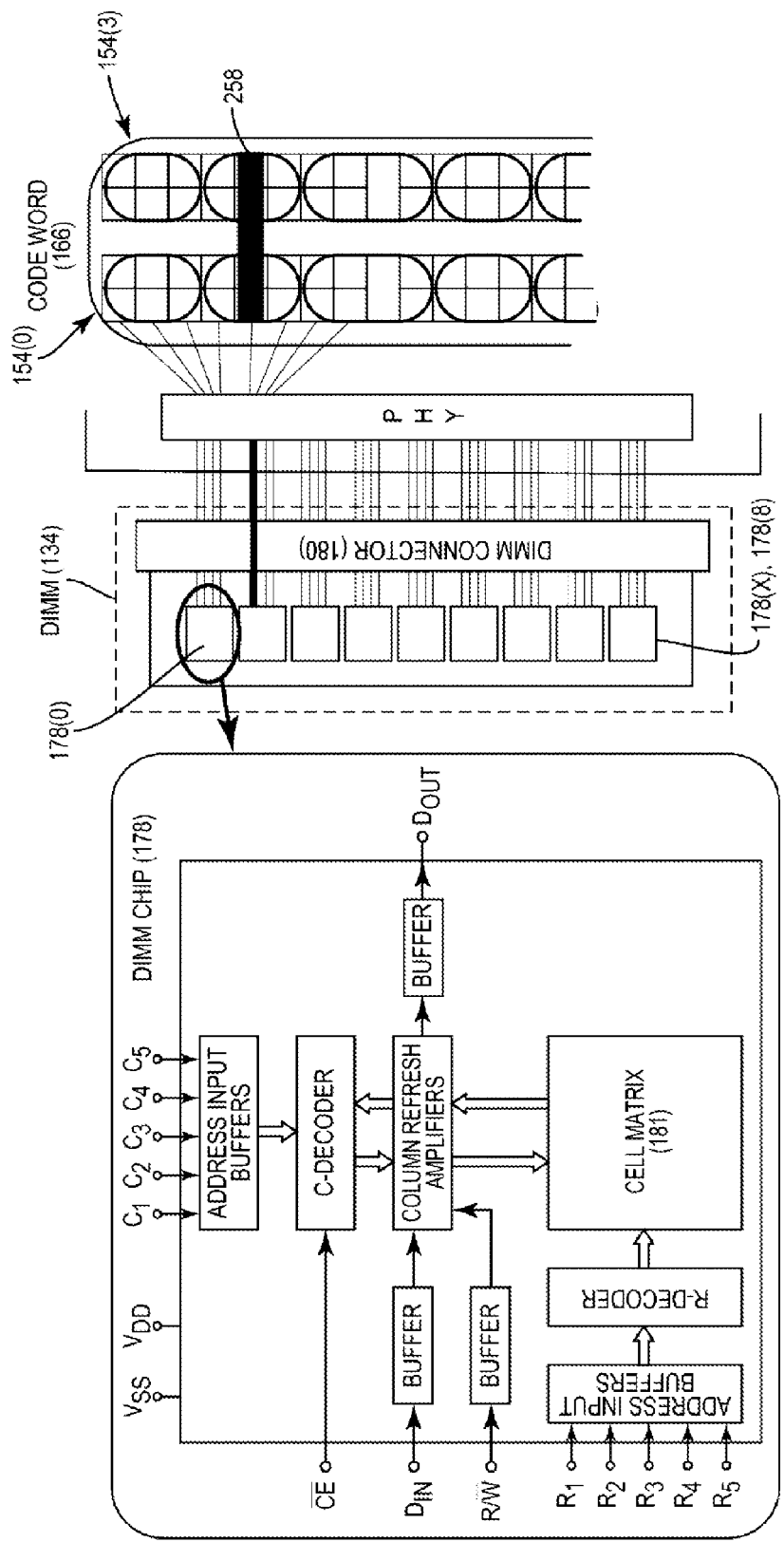
FIG. 13 is a diagram of the DIMM in FIG. 6 according to the exemplary data partition in FIG. 5 illustrating an exemplary memory bit lane failure.
Figure 14:
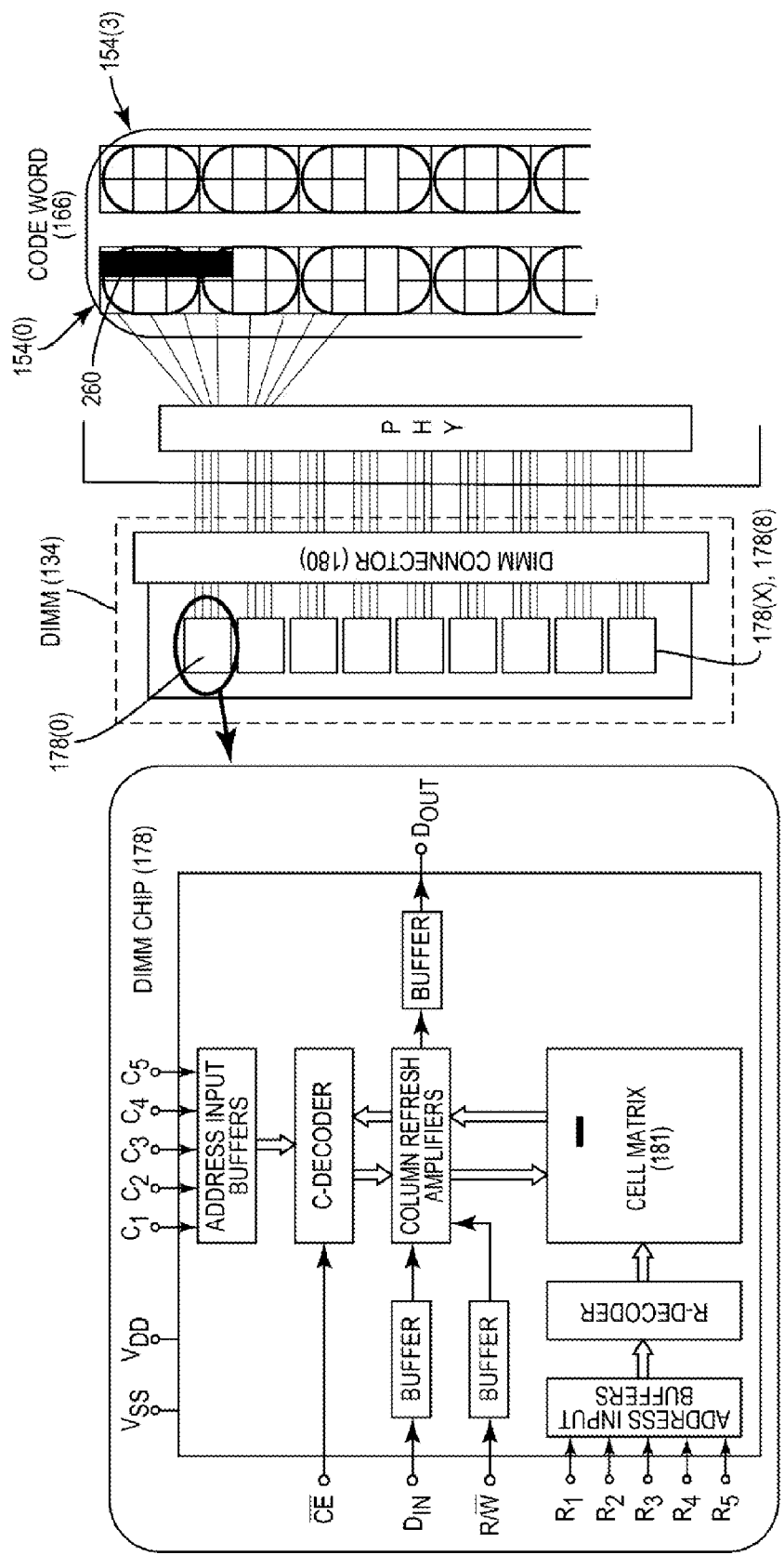
FIG. 14 is a diagram of the DIMM in FIG. 6 according to the exemplary data partition in FIG. 5 configured in four (4) bit width and illustrating an exemplary memory data word failure.

FIG. 12 is a diagram of the DIMM 134 in FIG. 6 according to the exemplary data partition in FIG. 5 illustrating an exemplary memory column 256 failure. A failed memory column 256 will appear as having a bit error in the same column 256 in at least two (2) adjacent data symbols 168 or check symbols 170. FIG. 13 is a diagram of the DIMM 134 in FIG. 6 according to the exemplary data partition in FIG. 5 illustrating an exemplary bit lane 258 failure in the DIMM 134. As shown in FIG. 13, a bit lane 258 failure can be detected based on at least one bit error being detecting in a bit lane 258 in at least two (2) adjacent symbols in the data symbols 168 and/or check symbols 170 based on a bit error correction code. In the DIMM 134 in FIG. 14 configured in four (4) bit width, an exemplary four (4) bit word 260 failure will appear as four (4) adjacent bit cells, which cross adjacent symbols among the data symbols 168 and/or check symbols 170.

DIMMs supporting storage of a data indicator(s) in an ECC storage unit dedicated to storing an ECC according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 15:
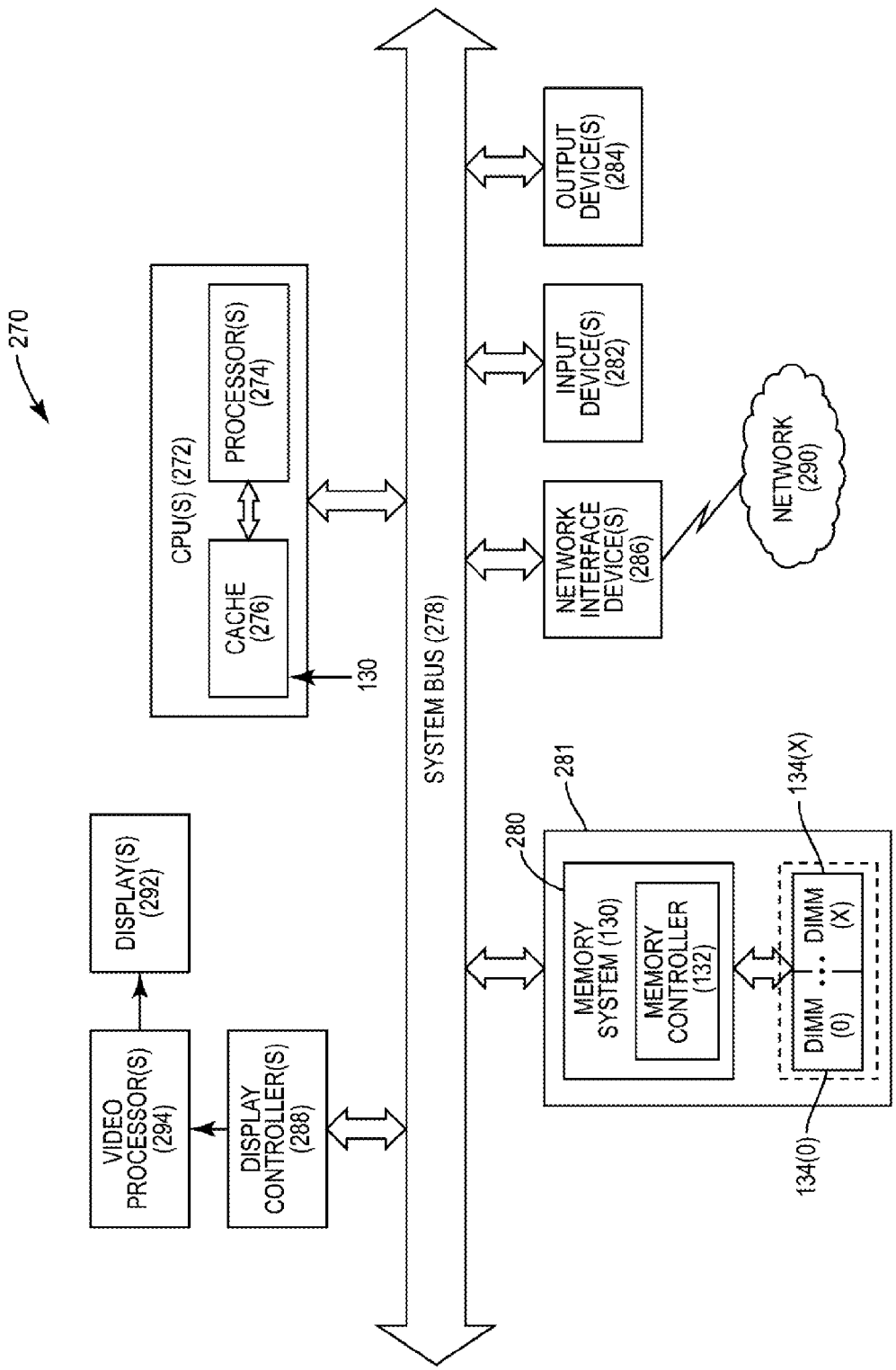
FIG. 15 is a block diagram of an exemplary computing device that may include a DIMM supporting storage of a data indicator(s) in an ECC storage unit dedicated to storing an ECC, according to any of the exemplary aspects disclosed herein, including but not limited to the DIMM in the memory system in FIG. 4.

In this regard, FIG. 15 illustrates an example of a processor-based system 270 that can employ the SoC 10' of FIG. 2 with the memory system 130 including the memory controller 132 and the DIMM 134 (shown as DIMMs 134(0)-134(X)) of FIG. 4. In this example, the processor-based system 270 includes one or more CPUs 272, each including one or more processors 274. The CPU(s) 272 may have cache memory 276 coupled to the processor(s) 274 for rapid access to temporarily stored data. As a non-limiting example, the cache memory 276 could include a memory system like the memory system 130 in FIG. 4. The CPU(s) 272 is coupled to a system bus 278 and can intercouple devices included in the processor-based system 270. As is well known, the CPU(s) 272 communicates with these other devices by exchanging address, control, and data information over the system bus 278. For example, the CPU(s) 272 can communicate bus transaction requests to a memory controller 280 as an example of a slave device. Although not illustrated in FIG. 15, multiple system buses 278 could be provided.

Other devices can be connected to the system bus 278. As illustrated in FIG. 15, these devices can include a memory system 281, one or more input devices 282, one or more output devices 284, one or more network interface devices 286, and one or more display controllers 288, as examples. The memory system 281 can include the memory system 130 in FIG. 4 as an example. The input device(s) 282 can include any type of input device, including but not limited to input keys, switches, voice processors, etc. The output device(s) 284 can include any type of output device, including but not limited to audio, video, other visual indicators, etc. The network interface device(s) 286 can be any devices configured to allow exchange of data to and from a network 290. The network 290 can be any type of network, including but not limited to a wired or wireless network, a private or public network, a local area network (LAN), a wide local area network, wireless local area network, BLUETOOTH (BT), and the Internet. The network interface device(s) 286 can be configured to support any type of communications protocol desired. The memory system 281 can include the DIMMs 134(0)-134(X).

The CPU(s) 272 may also be configured to access the display controller(s) 288 over the system bus 278 to control information sent to one or more displays 292. The display controller(s) 288 sends information to the display(s) 292 to be displayed via one or more video processors 294, which process the information to be displayed into a format suitable for the display(s) 292. The display(s) 292 can include any type of display, including but not limited to a cathode ray tube (CRT), a liquid crystal display (LCD), a light emitting diode (LED) display, a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:
1. A dual in-line memory module (DIMM), comprising:
 a plurality of burst data storage units;
 each burst data storage unit among the plurality of burst data storage units comprising:
  a burst data word storage unit striped over a plurality of data line storage units totaling a burst length, each data line storage unit among the plurality of data line storage units comprising sixty-four (64) data bit cells; and
  a burst error correcting code (ECC) storage unit striped over a plurality of ECC line storage units, each ECC line storage unit among the plurality of ECC line storage units corresponding to a data line storage unit, each ECC line storage unit comprising eight (8) data bit cells; and
 the DIMM configured to:
  receive a write data address for a burst memory write request;
  receive burst write data of a burst write data block length for the burst memory write request, the burst write data comprising a burst write data word, a burst ECC word for the burst write data word, and at least one data indicator for the burst write data word;
  stripe the received burst write data word across the burst data word storage unit at the received write data address;
  stripe the received burst ECC word for the burst write data word across the burst ECC storage unit in fewer bits than a number of data bit cells in the burst ECC storage unit at the received write data address; and store the at least one data indicator for the burst write data word in the burst ECC storage unit of the burst data storage unit at the received write data address.

2. The DIMM of claim 1, wherein the at least one data indicator for the burst write data word is comprised of a single bit data indicator;
wherein the DIMM is configured to store the single bit data indicator for the burst write data word in a single bit of the burst ECC storage unit of the burst data storage unit at the received write data address.

3. The DIMM of claim 1, wherein the at least one data indicator for the burst write data word is comprised of a multiple bit data indicator;
wherein the DIMM is configured to store the multiple bit data indicator for the burst write data word in multiple bits of the burst ECC storage unit of the burst data storage unit at the received write data address.

4. The DIMM of claim 1, wherein the DIMM is configured to stripe the received burst ECC word for the burst write data word across the burst ECC storage unit in at least two fewer bits than the number of data bit cells in the burst ECC storage unit at the received write data address.

5. The DIMM of claim 1, further configured to:
receive a memory read request comprising a read data address;
access the read data address to retrieve one or more burst read data stored at the read data address in the DIMM; and
communicate the one or more burst read data stored at the read data address to a memory controller, the one or more burst read data each comprising a burst read data word, a burst ECC word for the burst read data word, and the at least one data indicator for the burst read data word.

6. The DIMM of claim 1, wherein the DIMM is configured to receive the at least one data indicator for the burst write data word indicating if the burst write data word is compressed.

7. The DIMM of claim 1, wherein each burst data storage unit among the plurality of burst data storage units comprises the burst data word storage unit striped over four (4) data line storage units totaling the burst length.

8. The DIMM of claim 1 integrated into an integrated circuit (IC).

9. The DIMM of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

10. A method of writing data to a dual in-line memory module (DIMM) in a central processing unit (CPU)-based system, comprising:
receiving a memory write request in a DIMM, the memory write request comprising a write data address and burst write data of a burst write data block length, the burst write data comprising a burst write data word, a burst error correcting code (ECC) word for the burst write data word, and at least one data indicator for the burst write data word;
striping the received burst write data word across a burst data word storage unit in a burst data storage unit at the received write data address in the DIMM, the DIMM comprising:
a plurality of burst data storage units, each burst data storage unit among the plurality of burst data storage units comprising:
a burst data word storage unit striped over a plurality of data line storage units totaling a burst length, each data line storage unit among the plurality of data line storage units comprising sixty-four (64) data bit cells; and
a burst ECC storage unit striped over a plurality of ECC line storage units, each ECC line storage unit among the plurality of ECC line storage units corresponding to a data line storage unit, each ECC line storage unit comprising eight (8) data bit cells;
striping the received burst ECC word in the DIMM for the burst write data word across the burst ECC storage unit in fewer bits than a number of data bit cells in the burst ECC storage unit at the received write data address; and
storing the at least one data indicator for the burst write data word in the burst ECC storage unit of the burst data storage unit at the received write data address.

11. The method of claim 10, wherein storing the at least one data indicator for the burst write data word in the burst ECC storage unit of the burst data storage unit at the received write data address comprises storing the at least one data indicator comprised of a single bit data indicator for the burst write data word in a single bit of the burst ECC storage unit of the burst data storage unit at the received write data address.

12. The method of claim 10, wherein storing the at least one data indicator for the burst write data word in the burst ECC storage unit of the burst data storage unit at the received write data address comprises storing the at least one data indicator comprised of a multiple bit data indicator for the burst write data word in multiple bits of the burst ECC storage unit of the burst data storage unit at the received write data address.

13. The method of claim 10, comprising striping the received burst ECC word for the burst write data word across the burst ECC storage unit in at least two fewer bits than the number of data bit cells in the burst ECC storage unit at the received write data address.

14. The method of claim 10, further comprising:
receiving a memory read request comprising a read data address in the DIMM;
accessing the read data address in the DIMM to retrieve one or more burst read data stored at the read data address in the DIMM; and
communicating the one or more burst read data stored at the read data address to a memory controller, the one or more burst read data each comprising a burst read data word, a burst ECC word for the burst read data word, and the at least one data indicator for the burst read data word.

15. A memory system for a central processing unit (CPU)-based system, comprising:
a dual in-line memory module (DIMM), comprising:
a plurality of burst data storage units;
each burst data storage unit among the plurality of burst data storage units comprising:
a burst data word storage unit striped over a plurality of data line storage units totaling a burst length, each data line storage unit among the plurality of data line storage units comprising sixty-four (64) data bit cells; and
a burst error correcting code (ECC) storage unit striped over a plurality of ECC line storage units, each ECC line storage unit among the plurality of ECC line storage units corresponding to a data line storage unit, each ECC line storage unit comprising eight (8) data bit cells; and
the DIMM configured to:
receive a burst memory write request comprising a write data address and burst write data of a burst write data block length, the burst write data comprising a burst write data word, a burst ECC word for the burst write data word, and at least one data indicator for the burst write data word;
stripe the received burst write data word across the burst data word storage unit at the received write data address;
stripe the received burst ECC word for the burst write data word across the burst ECC storage unit in fewer bits than a number of data bit cells in the burst ECC storage unit at the received write data address; and
store the at least one data indicator for the burst write data word in the burst ECC storage unit of the burst data storage unit at the received write data address; and
a memory controller configured to:
receive a memory write request comprising the write data address and write data of a write data block length;
calculate one or more burst ECC words for the write data, each of the one or more burst ECC words having a length less than the number of data bit cells in the burst ECC storage unit, according to a defined ECC;
construct one or more burst write data of the burst write data block length based on the write data, each of the one or more burst write data comprising a burst write data word, a burst ECC word for the burst write data word, and at least one data indicator for the burst write data word; and
communicate the write data address and the one or more burst write data words to the DIMM to be stored at the write data address in the DIMM.

16. The memory system of claim 15, wherein the memory controller further comprises an ECC encoder configured to calculate the one or more burst ECC words for the write data, each of the one or more burst ECC words having the length less than the number of data bit cells in the burst ECC storage unit, according to the defined ECC.

17. The memory system of claim 15, wherein:
the memory controller is further configured to:
receive a memory read request comprising a read data address of a memory block in the DIMM;
communicate the memory read request to the DIMM;
receive one or more burst read data from the DIMM stored at the read data address in the DIMM, the one or more burst read data each comprising a burst read data word, a burst ECC word for the burst read data word, and the at least one data indicator for the burst read data word;
calculate the one or more burst ECC words for the one or more burst read data;
compare the calculated one or more burst ECC words for the one or more burst read data to determine if the one or more burst read data has a bit error; and
communicate the one or more burst read data from the DIMM on a bus; and
the DIMM is further configured to:
receive the memory read request comprising the read data address;
access the read data address to retrieve the one or more burst read data stored at the read data address in the DIMM; and
communicate the one or more burst read data stored at the read data address to the memory controller, each of the one or more burst read data each comprising a burst read data word, a burst ECC word for the burst read data word, and the at least one data indicator for the burst read data word.

18. The memory system of claim 17, wherein the memory controller further comprises an ECC decoder configured to:
calculate the one or more burst ECC words for the one or more burst read data; and
compare the calculated one or more burst ECC words for the one or more burst read data to determine if the one or more burst read data has a bit error.

19. The memory system of claim 18, wherein the ECC decoder is further configured to communicate the bit error on the bus.

20. The memory system of claim 17, wherein the memory controller is further configured to encode each of the one or more burst write data words into a plurality of bit symbols using a bit error correction code.

21. The memory system of claim 20, wherein the bit error correction code is comprised of a Reed-Solomon (RS) code.

22. The memory system of claim 21, wherein the memory controller is configured to encode each of the one or more burst write data words with the RS code by being configured to:
encode each of the one or more burst write data words into forty-three (43) six (6) bit symbols; and
encode each of the one or more burst ECC words into five (5) six (6) bit symbols.

23. The memory system of claim 20, wherein the memory controller is further configured:
detect a single bit error in a bit symbol for a burst read data among the one or more burst read data based on the bit error correction code; and
correct the single bit error in the bit symbol in the burst read data based on the bit error correction code.

24. The memory system of claim 20, wherein the memory controller is further configured to detect a row error based on at least one bit error being detected in at least three (3) adjacent bit symbols for a burst read data among the one or more burst read data in a memory row in the DIMM at the read data address, based on the bit error correction code.

25. The memory system of claim 20, wherein the memory controller is further configured to detect a row error based on at least one bit error being detected in at least two (2) adjacent bit symbols for a burst read data among the one or more burst read data in a memory column in the DIMM at the read data address, based on the bit error correction code.

26. The memory system of claim 20, wherein the memory controller is further configured to detect a row error based on at least one bit error being detected in a bit lane in at least two (2) adjacent bit symbols for a burst read data among the one or more burst read data in a memory column in the DIMM at the read data address, based on the bit error correction code.

27. A method of writing data to a memory system in a central processing unit (CPU)-based system, comprising:
receiving a memory write request comprising a write data address and write data of a write data block length;
calculating one or more burst error correcting code (ECC) words for the write data, each of the one or more burst ECC words having a length less than a number of data bit cells in a burst ECC storage unit, according to a defined ECC;
constructing one or more burst write data of a burst write data block length based on the write data, each of the one or more burst write data comprising a burst write data word, a burst ECC word for the burst write data word, and at least one data indicator for the burst write data word;
communicating the write data address and one or more burst write data words to a dual in-line memory module (DIMM) to be stored at the write data address in the DIMM;
receiving the memory write request in the DIMM, the memory write request comprising the write data address and the one or more burst write data of the burst write data block length, the one or more burst write data comprising a burst write data word, a burst ECC word for the burst write data word, and at least one data indicator for the burst write data word;
striping the received burst write data word across a burst data word storage unit in a burst data storage unit at the received write data address in the DIMM, the DIMM comprising:
a plurality of burst data storage units, each burst data storage unit among the plurality of burst data storage units comprising:
a burst data word storage unit striped over a plurality of data line storage units totaling a burst length, each data line storage unit among the plurality of data line storage units comprising sixty-four (64) data bit cells; and
an ECC storage unit striped over a plurality of ECC line storage units, each ECC line storage unit among the plurality of ECC line storage units corresponding to a data line storage unit, each ECC line storage unit comprising eight (8) data bit cells;
striping the received one or more burst ECC words in the DIMM for the burst write data word across the burst ECC storage unit in fewer bits than a number of data bit cells in the burst ECC storage unit at the received write data address; and
storing the at least one data indicator for the burst write data word in the burst ECC storage unit of the burst data storage unit at the received write data address.

28. The method of claim 27, further comprising:
communicating a memory read request to the DIMM;
receiving the memory read request comprising a read data address in the DIMM;
accessing the read data address in the DIMM to retrieve one or more burst read data stored at the read data address in the DIMM;
communicating the one or more burst read data stored at the read data address to a memory controller, the one or more burst read data each comprising a burst read data word, a burst ECC word for the burst read data word, and the at least one data indicator for the burst read data word;
receiving the memory read request comprising the read data address of a memory block in the DIMM;
receiving the one or more burst read data from the DIMM stored at the read data address in the DIMM, the one or more burst read data each comprising a burst read data word, a burst ECC word for the burst read data word, and the at least one data indicator for the burst read data word;
calculating the one or more burst ECC words for the one or more burst read data;
comparing the calculated one or more burst ECC words for the one or more burst read data to determine if the one or more burst read data has a bit error; and
communicating the one or more burst read data words from the DIMM on a bus.

29. The method of claim 27, further comprising encoding each of the one or more burst write data words into a plurality of bit symbols using a bit error correction code.

30. The method of claim 29, wherein the bit error correction code is comprised of a Reed-Solomon (RS) code; and
comprising encoding each of the one or more burst write data words with the RS code by:
encoding each of the one or more burst write data words into forty-three (43) six (6) bit symbols; and
encoding each of the one or more burst ECC words into five (5) six (6) bit symbols.

* * * * *